(12) United States Patent
Jang

(10) Patent No.: US 11,158,616 B2
(45) Date of Patent: Oct. 26, 2021

(54) SEMICONDUCTOR PACKAGE WITH FIRST AND SECOND ENCAPSULANTS

(71) Applicant: SAMSUNG ELECTRONICS CO., LTD., Suwon-si (KR)

(72) Inventor: Minsek Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 20 days.

(21) Appl. No.: 16/580,011

(22) Filed: Sep. 24, 2019

(65) Prior Publication Data

US 2020/0144236 A1    May 7, 2020

(30) Foreign Application Priority Data

Nov. 7, 2018 (KR) .................. 10-2018-0135729

(51) Int. Cl.
| | | |
|---|---|---|
| *H01L 25/16* | (2006.01) | |
| *H01L 23/522* | (2006.01) | |
| *H01L 23/528* | (2006.01) | |
| *H01L 23/31* | (2006.01) | |
| *H01L 23/00* | (2006.01) | |

(52) U.S. Cl.
CPC .......... *H01L 25/16* (2013.01); *H01L 23/3128* (2013.01); *H01L 23/5226* (2013.01); *H01L 23/5283* (2013.01); *H01L 24/09* (2013.01); *H01L 24/17* (2013.01); *H01L 2224/02373* (2013.01); *H01L 2224/02377* (2013.01); *H01L 2224/02379* (2013.01); *H01L 2224/02381* (2013.01)

(58) Field of Classification Search
CPC ....................................................... H01L 25/16
USPC .................................................. 257/620, 774
See application file for complete search history.

(56) References Cited

U.S. PATENT DOCUMENTS

| | | | |
|---|---|---|---|
| 9,466,545 B1 | 10/2016 | Scanlan et al. | |
| 2014/0197550 A1* | 7/2014 | Iida ..................... | H01L 25/0657 257/784 |
| 2017/0309571 A1* | 10/2017 | Yl ........................... | H01L 24/20 |
| 2019/0244907 A1* | 8/2019 | Liao ........................ | H01L 24/19 |

FOREIGN PATENT DOCUMENTS

| | | |
|---|---|---|
| CN | 103441113 A  * | 12/2013 |
| KR | 10-1870169 B1 | 6/2018 |

* cited by examiner

*Primary Examiner* — Ajay Arora
(74) *Attorney, Agent, or Firm* — Sughrue Mion, PLLC

(57) ABSTRACT

A semiconductor package includes a connection structure including an insulating layer, a wiring layer disposed on the insulating layer, and a connection via penetrating through the insulating layer and connected to the wiring layer. A frame is disposed on the connection structure and has one or more through-holes, a semiconductor chip and a passive component are disposed on the connection structure in the one or more through-holes of the frame, a first encapsulant covers at least a portion of the passive component, and a second encapsulant covers at least a portion of the semiconductor chip. An upper surface of the second encapsulant is positioned at a level equal to or lower than an upper surface of the first encapsulant.

19 Claims, 15 Drawing Sheets

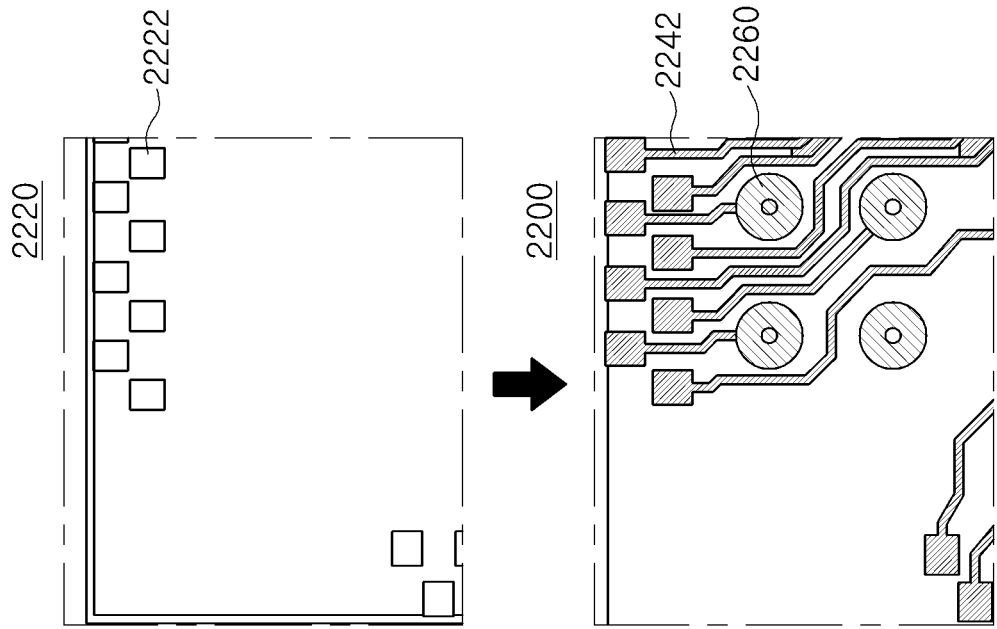
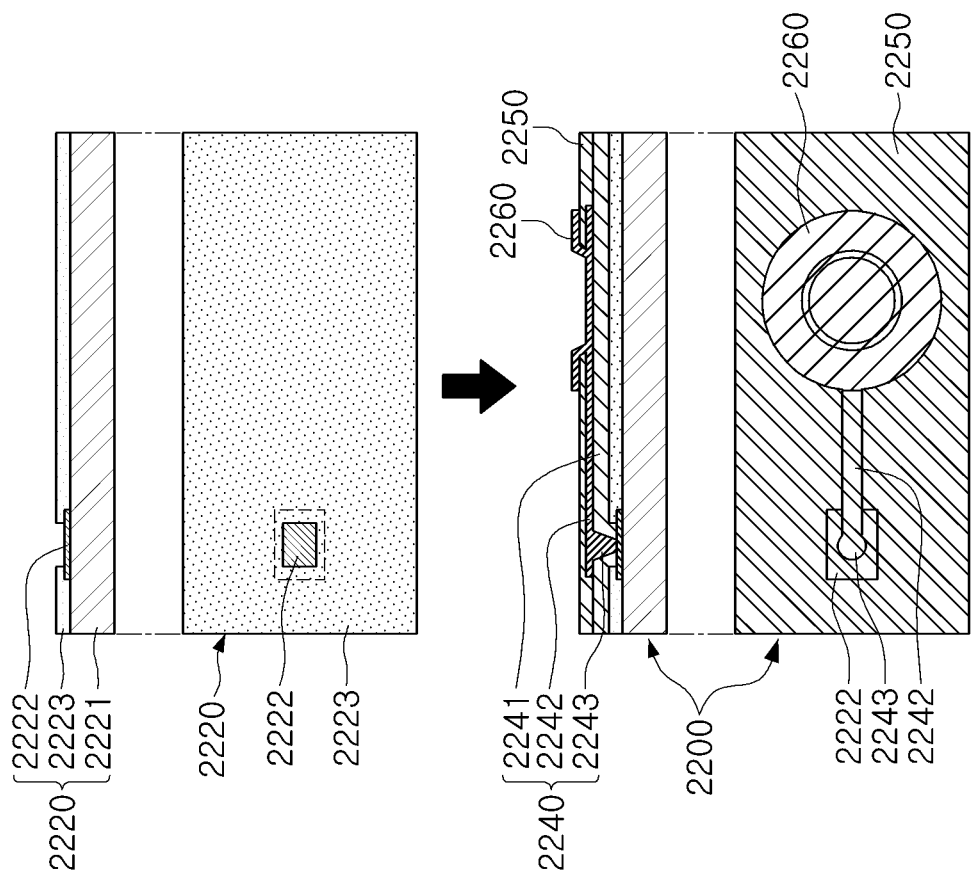
FIG. 3A
FIG. 3B

SEMICONDUCTOR PACKAGE WITH FIRST AND SECOND ENCAPSULANTS

CROSS-REFERENCE TO RELATED APPLICATION(S)

This application claims benefit of priority to Korean Patent Application No. 10-2018-0135729 filed on Nov. 7, 2018 in the Korean Intellectual Property Office, the disclosure of which is incorporated herein by reference in its entirety.

BACKGROUND

1. Field

The present disclosure relates to a semiconductor package in which a semiconductor chip is mounted and modularized into a single package together with a passive component.

2. Description of Related Art

In accordance with an increase in a size of displays for mobile devices, a demand for high capacity batteries has increased. In accordance with the increase in the capacity of the batteries, an area occupied by the battery in the mobile device has increased, and it has thus been desired to reduce a size of a printed circuit board (PCB). Therefore, an area in which components are mounted has reduced, such that an interest in modularization has continuously grown.

Meanwhile, an example of the related art of mounting a plurality of components may include chip onboard (COB) technology. A COB technology provides a manner of mounting individual passive elements and a semiconductor package on a printed circuit board such as a main board using surface mounting technology (SMT). However, while such a manner has an advantage in terms of a cost, a wide mounted area is required since a minimum interval has to be maintained between components, electromagnetic interference (EMI) between the components is large, and a distance between the semiconductor chip and the components is great, which results in increasing electrical noise.

SUMMARY

An aspect of the present disclosure may provide a semiconductor package capable of significantly reducing amounting area of a semiconductor chip and a passive component, significantly reducing electrical paths between the semiconductor chip and the passive component, and being reduced in thickness to be advantageous for miniaturization.

According to an aspect of the present disclosure, a semiconductor package may include a connection structure including an insulating layer, a wiring layer disposed on the insulating layer, and a connection via penetrating through the insulating layer and connected to the wiring layer. A frame is disposed on the connection structure and has one or more through-holes, a semiconductor chip and a passive component are disposed on the connection structure in the one or more through-holes of the frame, a first encapsulant covers at least a portion of the passive component, and a second encapsulant covers at least a portion of the semiconductor chip. Upper surfaces of the first and second encapsulants are surfaces of the first and second encapsulants that face away from the connection structure, and the upper surface of the second encapsulant is positioned at a distance from the connection structure equal to or less than the upper surface of the first encapsulant.

The upper surface of the first encapsulant and the upper surface of the second encapsulant may be coplanar.

The second encapsulant may not extend over the upper surface of the first encapsulant.

The semiconductor chip may have a thickness, measured orthogonally to a surface of the connection structure on which the semiconductor chip is disposed, which is smaller than a thickness of the passive component, measured orthogonally to a surface of the connection structure on which the passive component is disposed.

The semiconductor chip and the passive component may be disposed in the same through-hole of the one or more through-holes.

The first encapsulant may be disposed in the same through-hole to have a through-hole extending therethrough, and the semiconductor chip may be disposed in the through-hole extending through the first encapsulant.

A metal layer may be disposed on an inner wall of the through-hole extending through the first encapsulant.

The metal layer disposed on the inner wall of the through-hole extending through the first encapsulant may extend to cover the upper surface of the first encapsulant, and the upper surface of the second encapsulant and an upper surface of the metal layer formed on the upper surface of the first encapsulant may be coplanar.

The semiconductor chip and the passive component may be disposed in different through-holes of the one or more through-holes.

A metal layer may be disposed on an inner wall of each of the one or more through-holes of the frame.

The semiconductor chip may be disposed so that connection pads of the semiconductor chip face towards the connection structure.

A thickness of a region of the connection structure on which the semiconductor chip is disposed and a thickness of a region of the connection structure on which the passive component is disposed may be different from each other.

The thickness of the region of the connection structure on which the semiconductor chip is disposed may be smaller than the thickness of the region of the connection structure on which the passive component is disposed.

According to another aspect of the present disclosure, a semiconductor package may include a connection structure including an insulating layer, a wiring layer disposed on the insulating layer, and a connection via penetrating through the insulating layer and connected to the wiring layer. A frame is disposed on the connection structure and has one or more through-holes, a semiconductor chip and a passive component are disposed on the connection structure in the one or more through-holes of the frame, a first encapsulant covers at least a portion of the passive component, and a second encapsulant covers at least a portion of the semiconductor chip. The second encapsulant covers only a portion of an upper surface of the first encapsulant facing away from the connection structure.

Only a region of the first encapsulant in the vicinity of the semiconductor chip may be covered by the second encapsulant.

An upper surface of the second encapsulant, facing away from the connection structure, may have an upwardly convex shape.

According to a further aspect of the present disclosure, a semiconductor package may include a connection structure including an insulating layer, a plurality of wiring layers spaced apart from each other by the insulating layer, and a plurality of connection vias extending between wiring layers through the insulating layer. A frame is disposed on the connection structure and has at least one through-hole extending therethrough, and a semiconductor chip is disposed on the connection structure in the at least one through-hole and has a plurality of connection pads disposed on an active surface of the semiconductor chip that faces the connection structure. A passive component is disposed on the connection structure in the at least one through-hole. A first encapsulant covers at least a portion of the passive component, a second encapsulant covers at least a portion of the semiconductor chip, and a metal layer is disposed on a side wall of the first or second encapsulant between the semiconductor chip and the passive component.

The passive component may be disposed in contact with the connection structure, and the semiconductor chip may be disposed in contact with the connection structure.

The metal layer may extend along the side wall of the first encapsulant from the connection structure to a distance greater than a thickness of the frame.

The metal layer may be electrically connected to a wiring layer of the connection structure.

At least one connection via of the connection structure may extend from a wiring layer of the connection structure to a connection pad of the semiconductor chip, and at least another connection via of the connection structure may extend from a wiring layer of the connection structure to a terminal of the passive component.

BRIEF DESCRIPTION OF DRAWINGS

The above and other aspects, features and other advantages of the present disclosure will be more clearly understood from the following detailed description taken in conjunction with the accompanying drawings, in which:

FIGS. 3A and 3B are schematic cross-sectional views illustrating a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
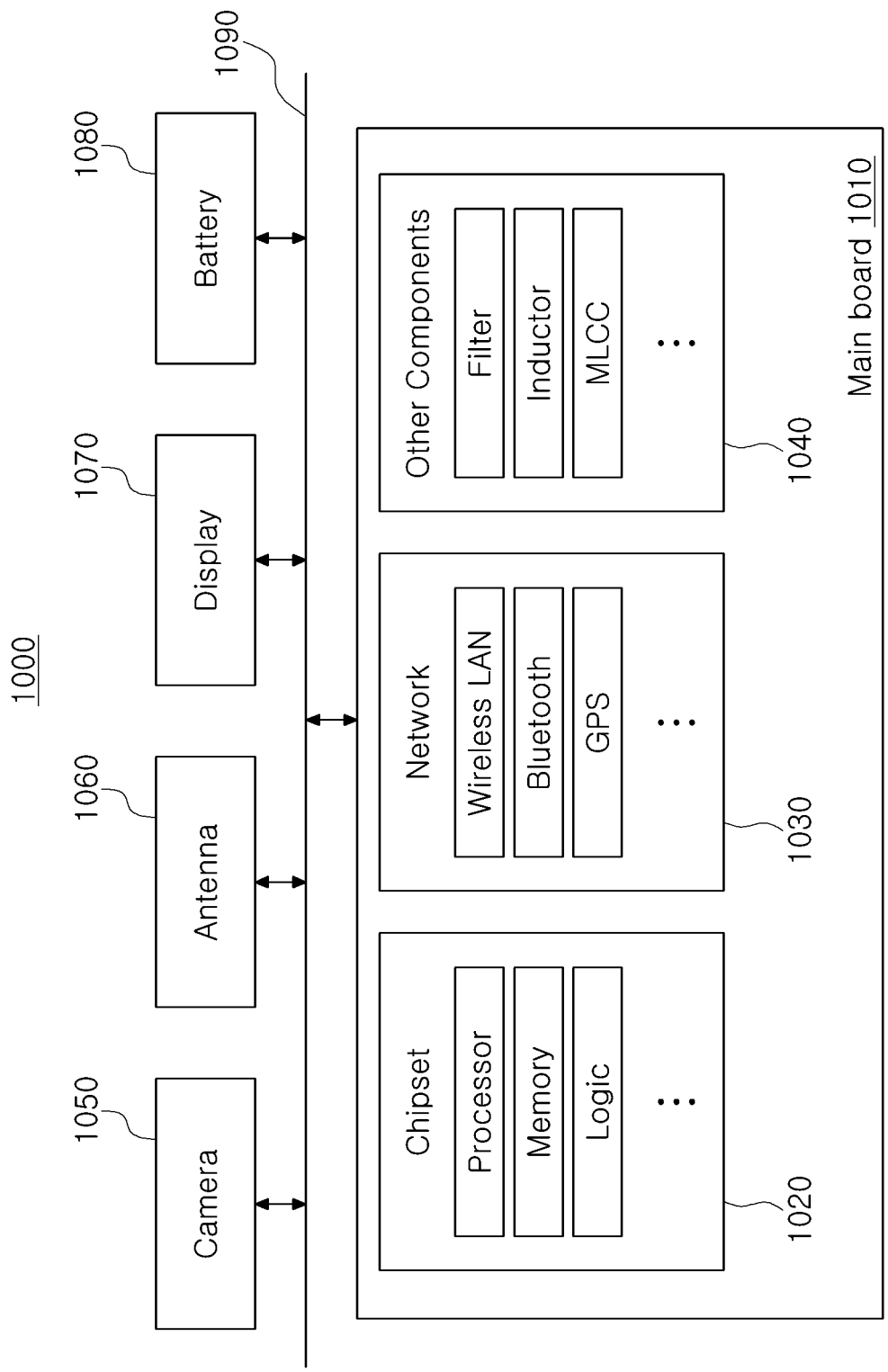
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically and/or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
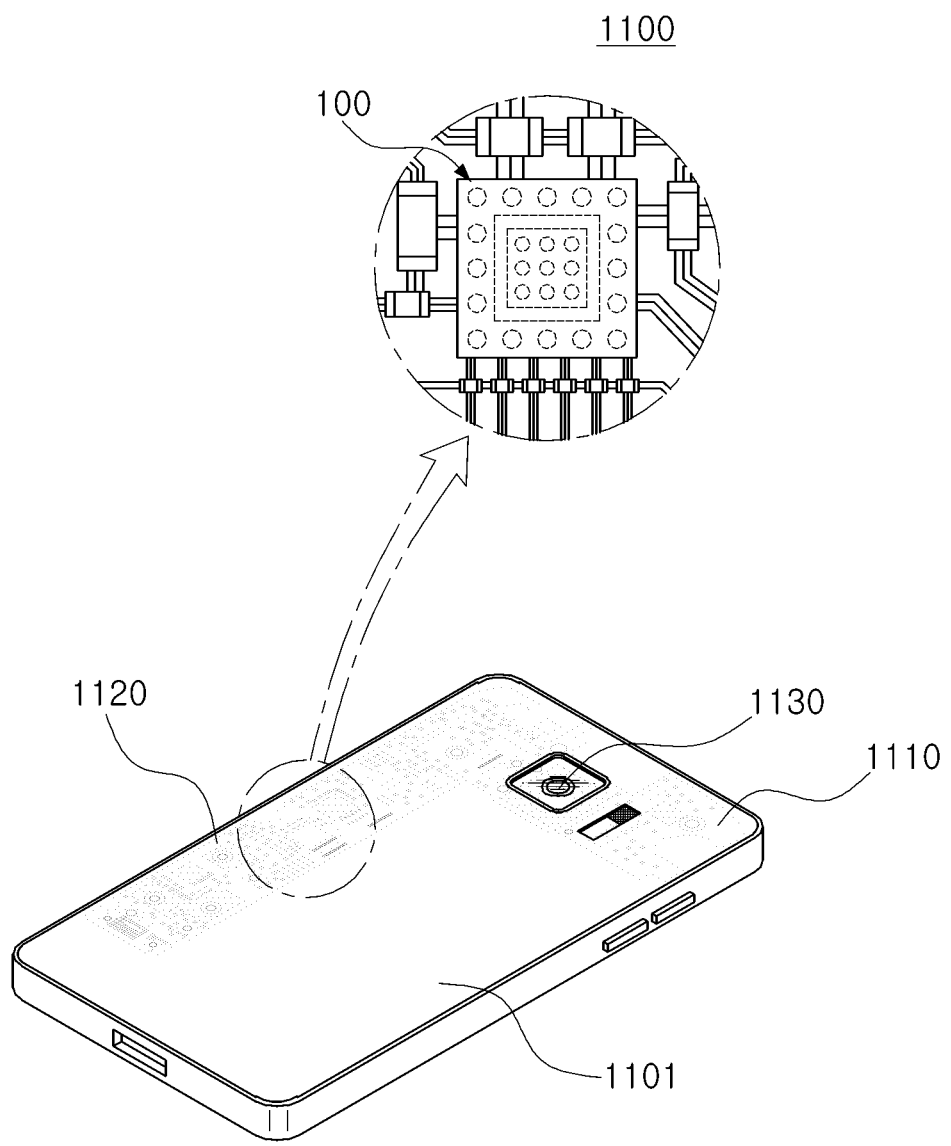
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a main board or the like may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is used due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is used.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
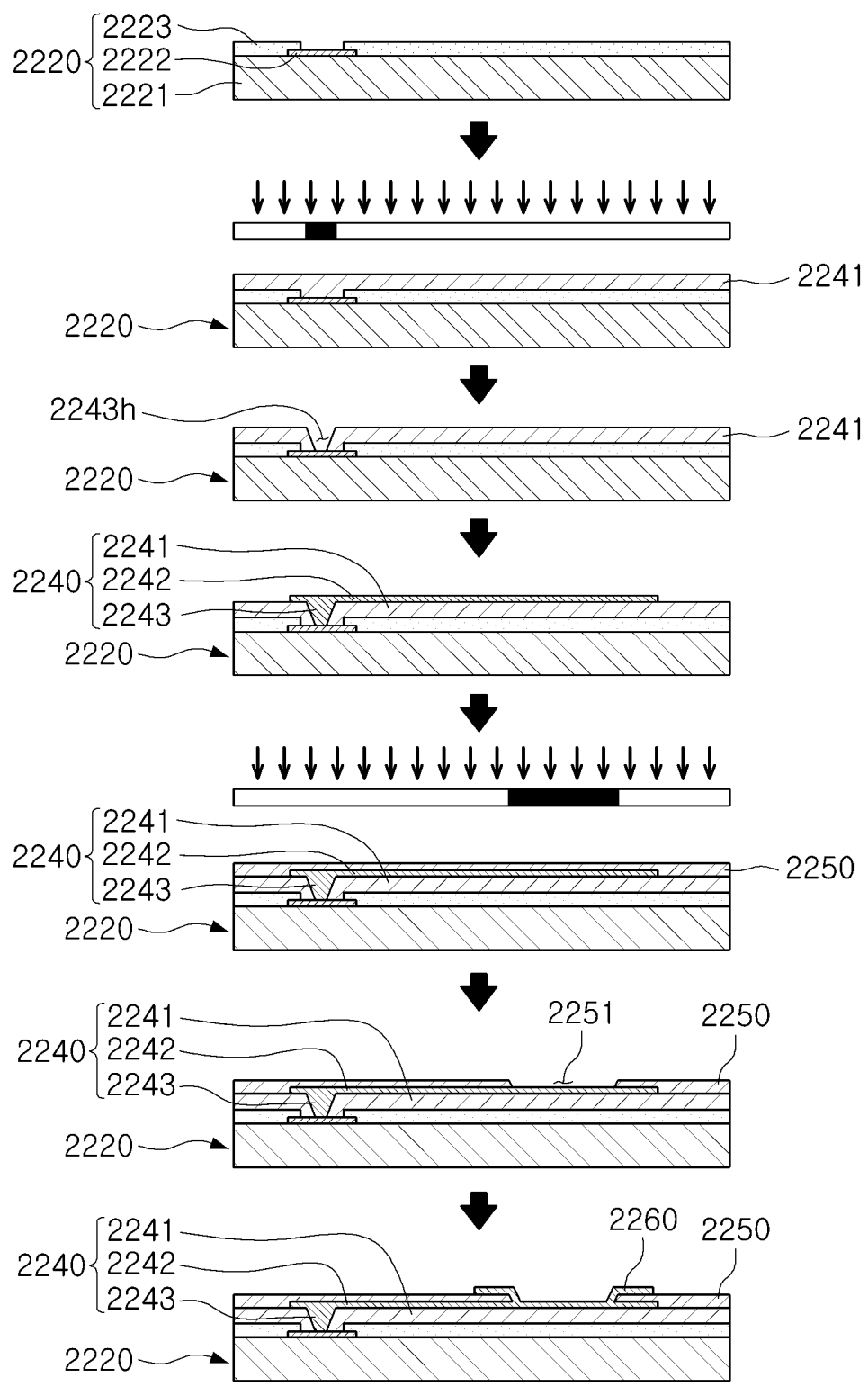
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as photo imageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
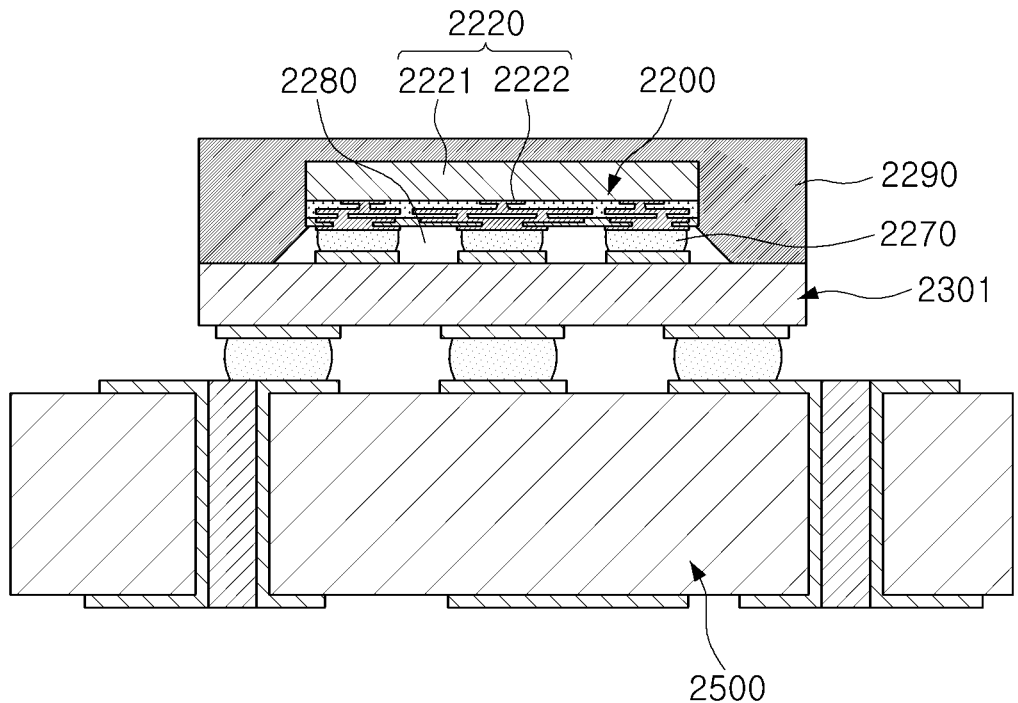
FIG. 5 is a schematic cross-sectional view illustrating a fan-in semiconductor package mounted on a printed circuit board and finally mounted on a main board of an electronic device.

FIG. 5 is a schematic cross-sectional view illustrating a case in which a fan-in semiconductor package is mounted on a printed circuit board and is finally mounted on a main board of an electronic device.

Figure 6:
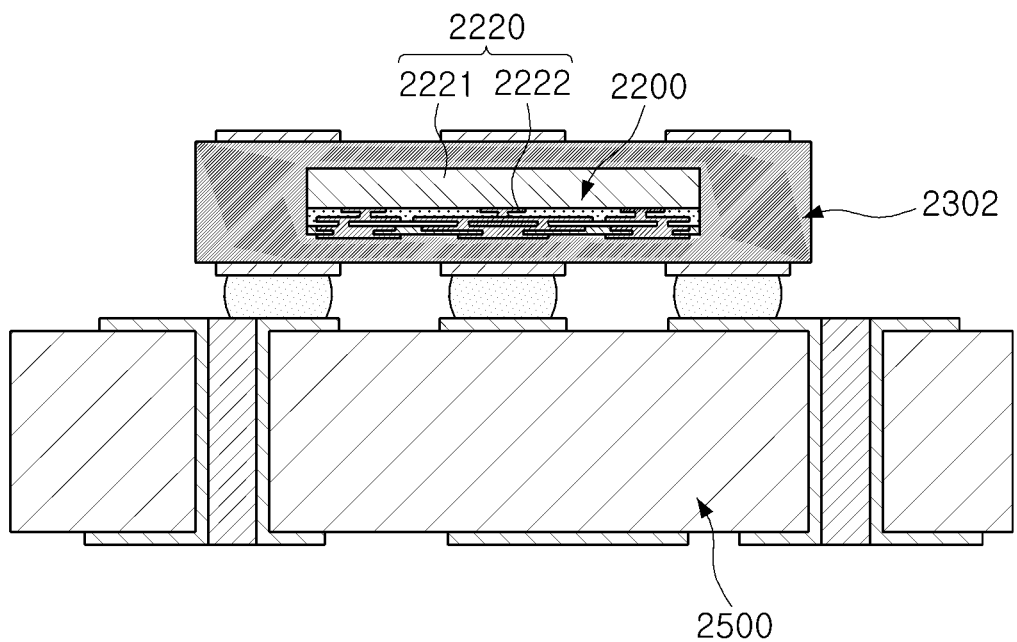
FIG. 6 is a schematic cross-sectional view illustrating a fan-in semiconductor package embedded in a printed circuit board and finally mounted on a main board of an electronic device.

FIG. 6 is a schematic cross-sectional view illustrating a case in which a fan-in semiconductor package is embedded in a printed circuit board and is finally mounted on a main board of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be finally mounted on a main board 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate printed circuit board and be then mounted on the main board of the electronic device through a packaging process or may be mounted and used on the main board of the electronic device in a state in which it is embedded in the printed circuit board.

Fan-Out Semiconductor Package

Figure 7:
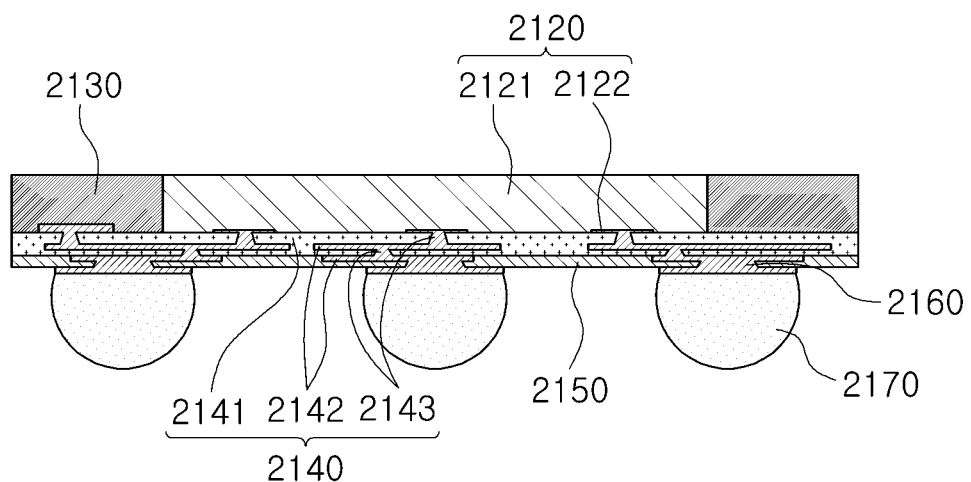
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. Here, a passivation layer 2150 may be further formed on the connection structure 2140, and underbump metal layers 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2241, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate printed circuit board, as described below.

Figure 8:
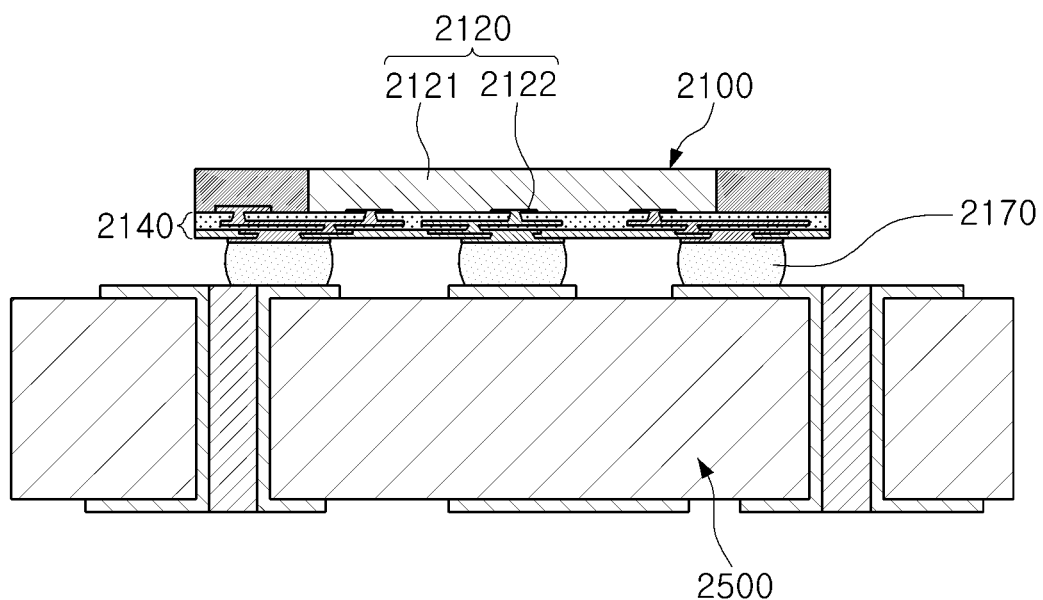
FIG. 8 is a schematic cross-sectional view illustrating a fan-out semiconductor package mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a printed circuit board, or the like.

As described above, since the fan-out semiconductor package may be mounted on the main board of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Hereinafter, a semiconductor package having a novel structure capable of significantly reducing a mounting area of a semiconductor chip and a passive component, significantly reducing an electrical path between the semiconductor chip and the passive component, significantly reducing a process defect such as undulation or crack, and easily connecting electrodes of the passive component with connection vias by a laser-via hole machining will be described with reference to the accompanying drawings.

Figure 9:
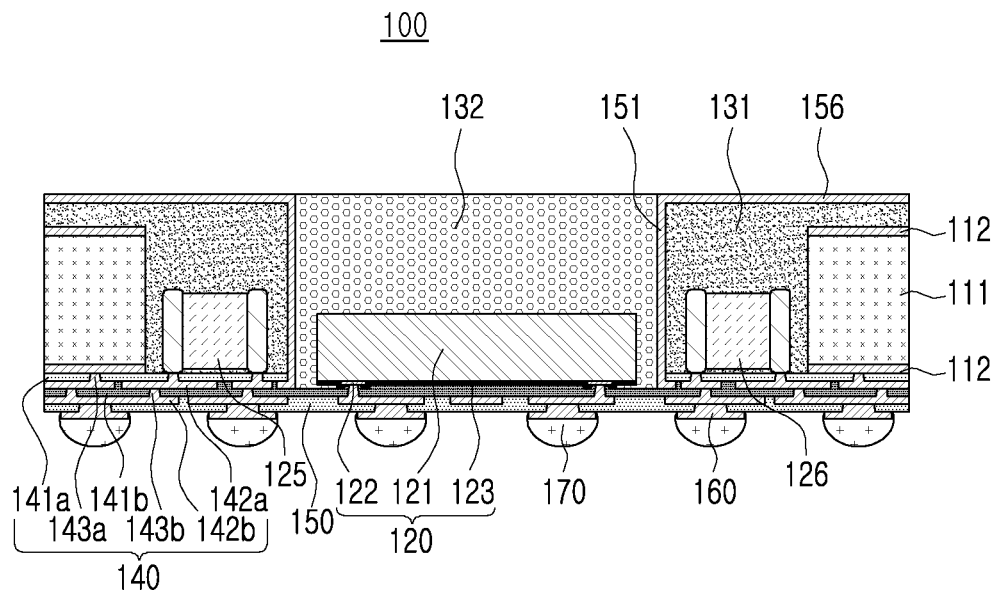
FIG. 9 is a schematic cross-sectional view illustrating an example of a semiconductor package.
Figure 10:
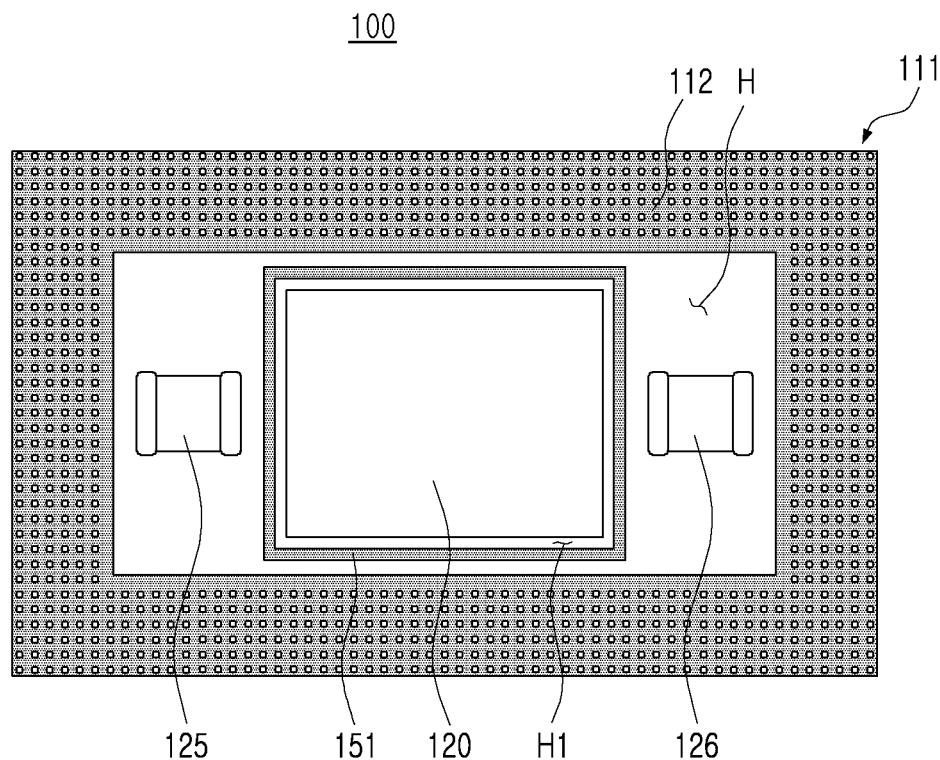
FIG. 10 is a plan view of the semiconductor package of FIG. 9 when viewed from above and illustrates a semiconductor chip, a passive component, an alignment mark, and the like as main components.
Figure 11:
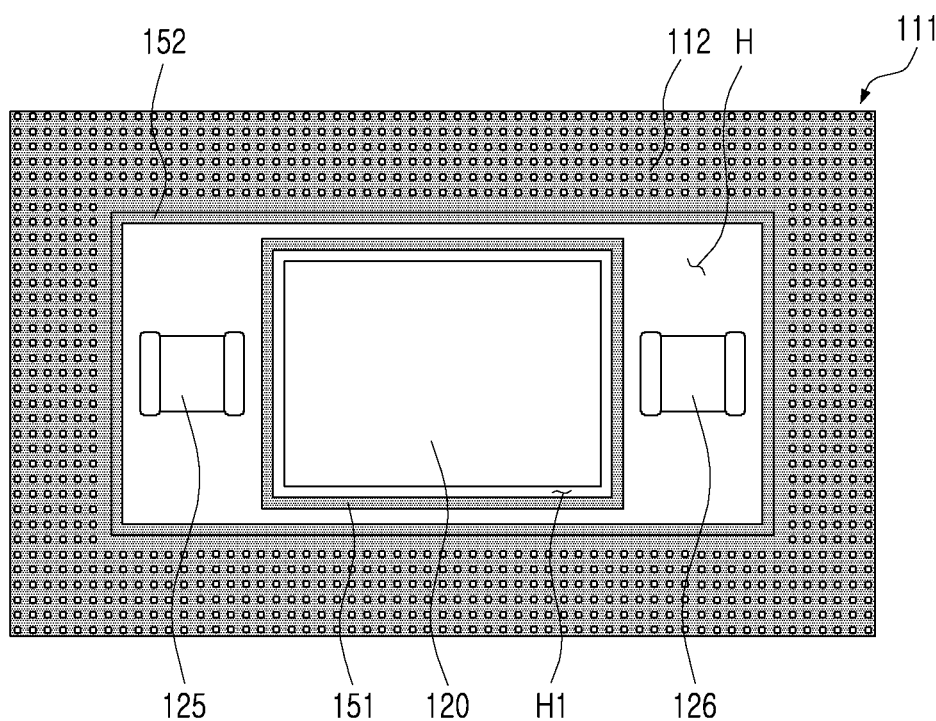
FIGS. 11 and 12 illustrate plan views of semiconductor packages according to modified examples.
Figure 12:
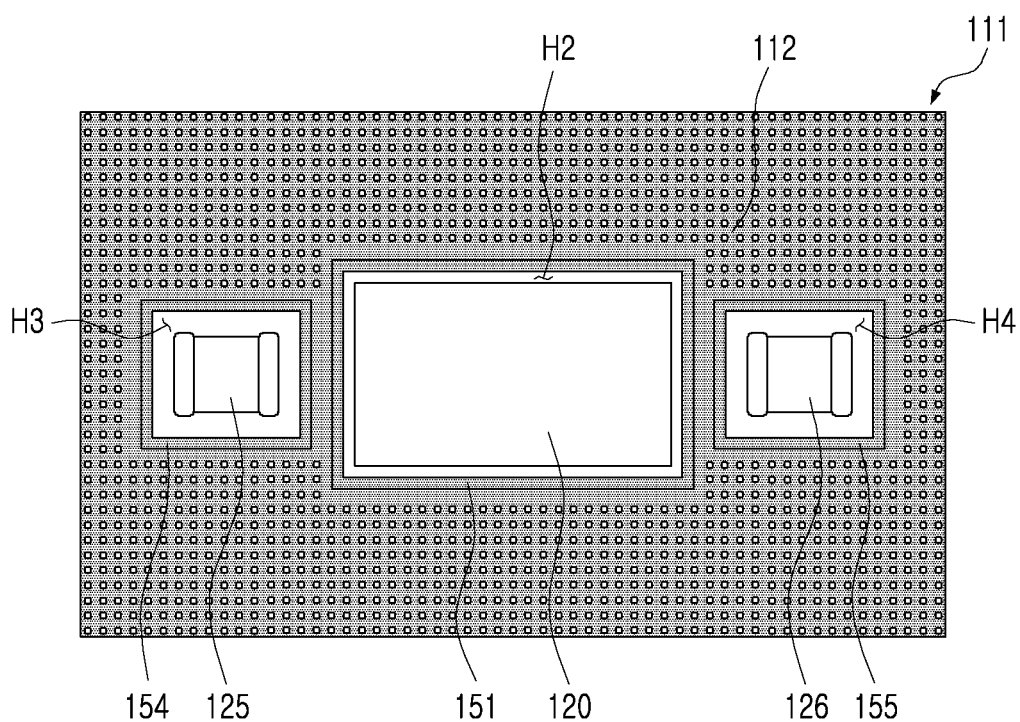

FIG. 9 is a schematic cross-sectional view illustrating an example of a semiconductor package. FIG. 10 is a plan view of the semiconductor package of FIG. 9 when viewed from above and illustrates a semiconductor chip, a passive component, an alignment mark, and the like as main components. In addition, FIGS. 11 and 12 illustrate plan views of semiconductor packages according to modified examples, and correspond to the view shown in FIG. 10.

Referring to FIGS. 9 and 10, a semiconductor package 100 according to an example may include a connection structure 140, a semiconductor chip 120, passive components 125 and 126, a first encapsulant 131, and a second encapsulant 132 as main components. An upper surface of the semiconductor chip 120 may be positioned at the same level as or a level lower than an upper surface of the first encapsulant 131. In addition, the semiconductor package 100 may further include a frame 111, a wiring layer 112, a passivation layer 150, metal layers 151 and 156, underbump metal layers 160, electrical connection metals 170, and the like.

The connection structure 140 may include insulating layers 141a and 141b, wiring layers 142a and 142b disposed on the insulating layers 141a and 141b, and connection vias 143a and 143b penetrating through the insulating layers 141a and 141b and connected to the wiring layers 142a and 142b. The connection structure 140 having the form as described above may redistribute the connection pads 122 of the semiconductor chip 120. In addition, the connection structure 140 may electrically connect the connection pads 122 of the semiconductor chip 120 to the passive components 125 and 126, or the like. Several tens to several millions of connection pads 122 of the semiconductor chip 120 having various functions may be redistributed by the connection structure 140. The connection structure 140 may be designed with a smaller number of layers or a larger number of layers than those illustrated in the drawing.

In the present exemplary embodiment, the insulating layers 141a and 141b may include a first insulating layer 141a and a second insulating layer 141b. As shown, the first insulating layer 141a may be disposed below (e.g., immediately below, and in contact with) the frame 111 and the passive components 125 and 126, and a first wiring layer 142a and a first connection via 143a may be disposed on a lower surface of the first insulating layer 141a. In addition, the second insulating layer 141b may be disposed on a lower surface of the first insulating layer 141a and an active surface of the semiconductor chip 120 and may cover at least a portion of the first wiring layer 142a. A second connection via 143b penetrates through the second insulating layer 141b and connects to the first and second wiring layers 142a and 142b, and the connection pads 122 of the semiconductor chip 120. The second wiring layer 142b may be disposed on a lower surface of the second insulating layer 141b.

As the connection structure 140 has the above-mentioned structure, levels of a region in which the semiconductor chip 120 is disposed and a region in which the passive components 125 and 126 are disposed may be different from each other. Specifically, as shown, the level of the region in which the semiconductor chip 120 is disposed (e.g., the level of the upper surface of the connection structure 140 in the region) may be lower than the level of the region in which the passive components 125 and 126 are disposed. However, the connection structure 140 does not necessarily include the first and second insulating layers 141a and 141b but only one kind of insulating layer may be used depending on the exemplary embodiment.

A material of the first insulating layer 141a may be an insulating material. In this case, the insulating material may be a non-photo imageable dielectric material including inorganic filler such as silica or alumina, for example, ABF. In this case, an undulation problem and a problem of defect due to a crack occurrence may be more effectively solved. In addition, a problem of electrode open defect of the passive components 125 and 126 due to bleeding of a material forming the first encapsulant 131 may be effectively solved. That is, when the non-photo imageable dielectric material including the inorganic filler is used as the material of the first insulating layer 141a, the problem of the case in which the photo imageable dielectric (PID) material is simply used may be more effectively solved.

A photo imageable dielectric (PID) material may be used as a material of the second insulating layer 141b. In this case, a fine pitch may also be introduced through a photo via, and several hundreds to several millions of connection pads 122 of the semiconductor chip 120 may be thus very effectively redistributed similarly to a normal case. The photo imageable dielectric (PID) material may or may not include a small amount of inorganic filler. That is, by selectively controlling the materials of the first insulating layer 141a on which the first wiring layer 142a and the first connection via 143a for redistributing the passive components 125 and 126 are formed, and the second insulating layer 141b on which the second wiring layer 142b and the second connection via 143b for redistributing the connection pads 122 of the semiconductor chip 120 are formed, a better synergy effect may be created.

Meanwhile, optionally, the first insulating layer 141a, formed of the non-photo imageable dielectric (PID) material including the inorganic filler, may be a plurality of layers, and the second insulating layer 141b, formed of the photo imageable dielectric (PID) material, may be a plurality of layers, all of which may be a plurality of layers. In this case, a through-hole H1 formed in the first encapsulant 131 may penetrate through the first insulating layer 141a, and may penetrate through a plurality of layers when the first insulating layer 141a is the plurality of layers.

The first insulating layer 141a may have a coefficient of thermal expansion (CTE) smaller than that of the second insulating layer 141b. The reason is because the first insulating layer 141a includes the inorganic filler. The second insulating layer 141b may optionally include a small amount of inorganic filler, but in this case, a weight percentage of the inorganic filler included in the first insulating layer 141a may be greater than the weight percentage of the inorganic filler of the second insulating layer 141b. Therefore, the coefficient of thermal expansion (CTE) of the first insulating layer 141a may be smaller than the coefficient of thermal expansion (CTE) of the second insulating layer 141b. The first insulating layer 141a having a relatively larger amount of inorganic filler has a relatively small coefficient of thermal expansion (CTE), and thus has a small thermosetting shrinkage and is advantageous for minimizing warpage. As a result, as described above, the problem of undulation or crack occurrence may be more effectively solved, and the problem of the electrode open defect of the passive components 125 and 126 may also be more effectively solved.

The first wiring layer 142a may redistribute electrodes of the passive components 125 and 126 and electrically connect the electrodes to the connection pads 122 of the semiconductor chip 120. That is, the first wiring layer 142a may serve as a redistribution layer (RDL). A material of the first wiring layer 142a may be a conductive material such as copper (Cu), aluminum (Al), silver (Ag), tin (Sn), gold (Au), nickel (Ni), lead (Pb), titanium (Ti), or alloys thereof. The first wiring layer 142a may perform various functions depending on a design thereof. For example, the first wiring layer 142a may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first wiring layer 142a may include via pads, and the like. Since the through-hole H1 in which the semiconductor chip 120 is disposed also penetrates through the first insulating layer 141a, a lower surface of the first wiring layer 142a may be positioned at the substantially same level as that of the active surface of the semiconductor chip 120. That is, the lower surface of the first wiring layer 142a may be co-planar with the active surface of the semiconductor chip 120.

The second wiring layer 142b may redistribute the connection pads 122 of the semiconductor chip 120 and electrically connect the connection pads 122 to the electrical connection structure 170. That is, the second wiring layer 142b may serve as a redistribution layer (RDL). A material of the second wiring layer 142b may also be a conductive material such as copper (Cu), aluminum (Al), silver (Ag), tin (Sn), gold (Au), nickel (Ni), lead (Pb), titanium (Ti), or alloys thereof described above. The second wiring layer 142 may also perform various functions depending on a design thereof. For example, the second wiring layer 142b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second wiring layer 142b may include via pads, electrical connection structure pads, and the like.

The first connection vias 143a may electrically connect the passive components 125 and 126 and the first redistribution layer 142a to each other. A respective first connection via 143a may be in physical contact with each of the electrodes of the passive components 125 and 126. That is, the passive components 125 and 126 may be in direct contact with the respective first connection vias 143a in an embedded type, not the surface mounting form using a solder bump, or the like. A material of the first connection via 143a may be a conductive material such as copper (Cu), aluminum (Al), silver (Ag), tin (Sn), gold (Au), nickel (Ni), lead (Pb), titanium (Ti), or alloys thereof. The first connection via 143 may be completely filled with the conductive material, or the conductive material may also be formed along a wall of the via. In addition, the first connection via 143a may have a tapered shape.

The second connection via(s) 143b may electrically connect the first and second wiring layers 142a and 142b formed on different layers to each other, and may also electrically connect the connection pads 122 of the semiconductor chip 120 to the second wiring layer 142b. The second connection via(s) 143b may be in physical contact with the connection pads 122 of the semiconductor chip 120. That is, the semiconductor chip 120 may be directly connected to the second connection via(s) 143b of the connection structure 140 without a separate bump or the like in the form of a bare die. A material of the second connection via 143b may also be a conductive material such as copper (Cu), aluminum (Al), silver (Ag), tin (Sn), gold (Au), nickel (Ni), lead (Pb), titanium (Ti), or alloys thereof. The second connection via 143b may also be completely filled with the conductive material, or the conductive material may be formed along a wall of the via. In addition, as a shape of the second connection via 143b, a tapered shape may also be applied.

In the semiconductor package 100 according to the present exemplary embodiment, the passive components 125 and 126 may be disposed and modularized in a single package together with the semiconductor chip 120. Therefore, an interval between the components may be significantly reduced, and a mounting area occupied by the components on a printed circuit board such as a main board may be significantly reduced. In addition, electrical paths between the semiconductor chip 120 and the passive components 125 and 126 may be significantly reduced and may thereby help to solve a noise problem. In addition, sealing processes 131 and 132 of two steps or more may be performed rather than a single sealing, and therefore, a yield problem of the semiconductor chip 120 according to mounting defect of the passive components 125 and 126, or an influence of foreign substances generated when the passive components 125 and 126 are mounted may be significantly reduced.

Meanwhile, since the connection pads 122 of the semiconductor chip 120 are typically formed of aluminum (Al), the connection pads 122 may be easily damaged due to damage during laser-via machining. Therefore, it is common to create openings in the insulating layer (e.g., 141b) to expose the connection pads by a photo-via machining, not a laser via. To this end, as the insulating layer 141b provided to form the redistribution layer (RDL), the photo imageable dielectric (PID) material may be used. However, when the photo imageable dielectric (PID) material is stacked on the lower surfaces of the passive components by the same manner to form the redistribution layer (RDL), the undulation may occur due to protrusion of the electrodes of the passive components, and as a result, flatness of the photo imageable dielectric (PID) material may be decreased. Therefore, there is an inconvenience of using a photo imageable dielectric (PID) material having a thick thickness in order to increase the flatness, and in this case, there is a problem that a large number of cracks occur easily due to the thickness of the photo imageable dielectric (PID).

In addition, when the passive components are sealed by using the encapsulant 131, a problem that a material of the encapsulant 131 bleeds into the electrodes of the passive components may occur. In this case, when the photo imageable dielectric (PID) material is used to form the redistribution layer (RDL), the photo-via machining may be used as described above. In this case, it is difficult to open the material of the bled material of the encapsulant by the photo-via machining. Therefore, a defect of an electrode open may occur by the bled material of the encapsulant, and as a result, a decrease in electrical characteristics may be caused.

On the other hand, in the semiconductor package 100 according to an example, after through-holes H in which the passive components 125 and 126 are disposed are formed, the passive components 125 and 126 may be disposed, and the first insulating layer 141a and the first wiring layer 142a may be then primarily formed to redistribute the passive components 125 and 126. Thereafter, a through-hole H1 penetrating through the first insulating layer 141a may be formed in the first encapsulant 131 and the semiconductor chip 120 may be disposed in the through-hole H1, and the second insulating layer 141b and the second wiring layer 142b may be secondarily formed to redistribute the connection pads of the semiconductor chip 120. That is, the through-hole H1 of the first encapsulant 131 in which the semiconductor chip 120 is disposed may penetrate through the first insulting layer 141a of the connection structure 140 as well as the frame 111, and accordingly, the active surface of the semiconductor chip 120 may be positioned below the lower surface of each of the passive components 125 and 126. In this case, the material of the first insulating layer 141a may be selected independently of the semiconductor chip 120, and for example, a non-photo imageable dielectric material including inorganic filler, for example, an Ajinomoto Build-up Film (ABF), or the like, not the photo imageable dielectric (PID) material may be used. Since a film type of non-photo imageable dielectric material has excellent flatness, it may more effectively solve the undulation problem and the problem of the crack occurrence described above.

In addition, since such a non-photo imageable dielectric material forms openings by a laser via, the electrodes may be effectively opened through the laser via even though the material of the first encapsulant 131 is bled into the electrodes of the passive components 125 and 126. Therefore, a problem caused by the electrode open defect may also be solved.

Further, in the semiconductor package 100 according to an example, the photo imageable dielectric (PID) material may be used as a material of the second insulating layer 141b as in a normal case. In this case, a fine pitch may also be introduced through a photo via, and several hundreds to several millions of connection pads 122 of the semiconductor chip 120 may be thus very effectively redistributed similarly to a normal case. That is, a structure of the semiconductor package 100 according to an example may selectively control the materials of the first insulating layer 141a on which the first wiring layer 142a and the first connection via 143a for redistributing the passive components 125 and 126 are formed, and the second insulating layer 141b on which the second wiring layer 142b and the second connection via 143b for redistributing the connection pads 122 of the semiconductor chip 120 are formed, and may thus have a better synergy effect.

The frame 111 may form a core region of the semiconductor package 100 to perform a supporting function, or the like. An insulating material for the frame 111 may be a thermosetting resin such as an epoxy resin, a thermoplastic resin such as polyimide, a resin in which the thermosetting resin and the thermoplastic resins are impregnated together with an inorganic filler such as silica in a core material such as a glass fiber (or a glass cloth or a glass fabric), for example, prepreg, Ajinomoto Build up Film (ABF), or the like.

As shown, the frame 111 may include at least one through-hole H, and in the present exemplary embodiment, the frame 111 may correspond to a structure having one through-hole H. In this case, as in a modified example of FIG. 11, a metal layer 152 may be disposed on an inner wall of the frame 111 in which the through hole H is formed (e.g., on an inner side wall of the through hole H). The metal layer 152 may include copper (Cu), aluminum (Al), silver (Ag), tin (Sn), gold (Au), nickel (Ni), lead (Pb), titanium (Ti), or alloys thereof, but is not limited thereto. In addition, an electromagnetic wave shielding and heat dissipation of the semiconductor chip 120 and the passive components 125 and 126 may be achieved through the metal layer 152. The metal layer 152 may be connected to the wiring layer 112 on the upper surface of the frame 111 and may also be used as a ground. In this case, the metal layer 112 may be electrically connected to the grounds of the wiring layers 142a and 142b of the connection structure 140.

The passive components 125 and 126 may be capacitors such as multilayer ceramic capacitors (MLCCs) or low inductance chip capacitors (LICCs), inductors such as power inductors, and beads, respectively. The passive components 125 and 126 may have different thicknesses. In addition, each of the passive components 125 and 126 may have a thickness different from that of the semiconductor chip 120. Since the semiconductor package 100 according to an example encapsulates the passive components 125 and 126 with two or more encapsulant application steps, a defect problem caused by such thickness deviation may be significantly reduced. The number of passive components 125 and 126 is not particularly limited, but may be more than that illustrated in the drawings or be less than that illustrated in the drawings.

The first encapsulant 131 may encapsulate each of the passive components 125 and 126. In addition, the first encapsulant 131 may fill the through-hole H and may cover at least a portion of an upper portion of the frame 111. The first encapsulant 131 may include an insulating material, and the insulating material may be a material including an inorganic filler and an insulating resin, for example, a thermosetting resin such as an epoxy resin, a thermoplastic resin such as polyimide, a resin having a reinforcing material such as an inorganic filler impregnated in the thermosetting resin and the thermoplastic resin, such as Ajinomoto Build up Film (ABF), FR-4, Bismaleimide Triazine (BT), or the like. In addition, a molding material such as an epoxy molding compound (EMC) may be used, and a photo imageable dielectric material, that is, a photo imageable encapsulant (PIE) may also be used, optionally. A material in which an insulating resin such as a thermosetting resin or a thermoplastic resin is impregnated in inorganic filler and/or a core material such as a glass fiber (or a glass cloth or a glass fabric) may also be used as the insulating material.

The semiconductor chip 120 may be disposed in the through-hole H1 of the first encapsulant 131, and may be disposed so that the connection pads 122 are directed towards (or facing towards) the connection structure 140. The semiconductor chip 120 may be spaced apart from a wall surface of the through-hole H1 and may be surrounded by the wall surface of the through-hole H1, but may be modified. As shown, the metal layer 151 may be disposed on side-wall surfaces of the through-hole H1 of the first encapsulant 131. The metal layer 151 may include copper (Cu), aluminum (Al), silver (Ag), tin (Sn), gold (Au), nickel (Ni), lead (Pb), titanium (Ti), or alloys thereof, but is not limited thereto. In addition, an electromagnetic wave shielding and heat dissipation of the semiconductor chip 120 and the passive components 125 and 126 may be achieved through the metal layer 151. In addition, the metal layer 151 may be extended onto the upper surface of the first encapsulant 131, and as a result, a metal layer 156 may also be disposed on the upper surface of the first encapsulant 131.

The semiconductor chip 120 may be an integrated circuit (IC) providing in an amount of several hundreds to several millions or more elements integrated in a single chip. In this case, the IC may be, for example, a power management IC (PMIC), but is not limited thereto. The IC may be a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an analog-to-digital converter, an application-specific IC (ASIC), or the like.

The semiconductor chip 120 may be an integrated circuit in a bare state in which a separate bump or wiring layer is not formed. The integrated circuit may be formed on the basis of an active wafer. In this case, a base material of the body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like without being particularly limited. A passivation layer 123 exposing the connection pads 122 may be formed on the body 121, and may be an oxide film, a nitride film, or the like, or a double layer of the oxide film and the nitride film. An insulating layer (not shown), and the like, may be further disposed on other appropriate positions. Meanwhile, a surface of the semiconductor chip 120 on which the connection pads 122 are disposed may be an active surface, and a surface of the semiconductor chip 120 opposing the active surface may be an inactive surface. In this case, when the passivation layer 123 is formed on the active surface of the semiconductor chip 120, the active surface of the semiconductor chip 120 may determine a positional relationship based on the lowest surface of the passivation layer 123.

In the present exemplary embodiment, the package 100 may be miniaturized by reducing the thickness of the semiconductor chip 120. In addition, when the semiconductor chip 120 is diced in units of chips as the thickness of the semiconductor chip 120 is reduced, machining characteristics of a cut surface (side surface) of the semiconductor chip 120 may be improved. That is, since the thickness of the semiconductor chip 120 is thin, dicing uniformity can be improved. Further, since a laser machining using other than a blade may be performed, the machining characteristics of the cut surface of the semiconductor chip 120 may be improved. As an example in which the semiconductor chip 120 is thin, the thickness of the semiconductor chip 120 may be smaller than that of each of the passive components 125 and 126. In the present exemplary embodiment, the second encapsulant 132 may be formed in a selective coating manner so as to cover the semiconductor chip 120 while thinning the semiconductor chip 120, which will be described below.

The second encapsulant 132 may encapsulate the semiconductor chip 120. In addition, the second encapsulant 132 may fill the through-hole H1 of the first encapsulant 131. For example, as shown, the second encapsulant 132 may cover side surfaces and an upper surface of the semiconductor chip 120. The second encapsulant 132 may include an insulating material, and for example, the insulating material may be a material including an inorganic filler and an insulating resin, for example, a thermosetting resin such as an epoxy resin, a thermoplastic resin such as polyimide, a resin having a reinforcing material such as inorganic filler included in the thermosetting resin and the thermoplastic resin, such as ABF, FR-4, BT, a PID resin, or the like. In addition, a molding material such as an epoxy molding compound (EMC), or the like, may also be used. Optionally, a material in which an insulating resin such as a thermosetting resin or a thermoplastic resin is impregnated in inorganic filler and/or a core material such as a glass fiber (a glass cloth or a glass fabric) may also be used.

The first encapsulant 131 and the second encapsulant 132 may include the same material, or may alternatively include different materials. Even in the case in which the first encapsulant 131 and the second encapsulant 132 include the same material, a boundary therebetween may form a discontinuous interface and may be confirmed or visible/identifiable. The first encapsulant 131 and the second encapsulant 132 may include similar materials and colors of the materials may be different from each other. For example, the first encapsulant 131 may be more transparent than the second encapsulant 132. That is, the boundary between the first and second encapsulants 131 and 132 may be apparent. The first encapsulant 131 may be formed of an insulating material and the second encapsulant 132 may be formed of a magnetic material. In this case, the second encapsulant 132 may have an EMI absorption effect.

As described above, in the present exemplary embodiment, the second encapsulant 132 may be disposed in the form that does not cover the upper surface of the first encapsulant 131. Such a form of the second encapsulant 132 may be obtained by selectively applying an encapsulating material to only the semiconductor chip 120 and a limited space therearound, that is, the through-hole H1 of the first encapsulant 131. When the thickness of the semiconductor chip 120 is relatively thick, for example is greater than that of each of the passive components 125 and 126 or the frame 111, the second encapsulant 132 may be over-molded to cover the upper portion of the first encapsulant 131. Therefore, there is a limit to miniaturization of the package 100. In the present exemplary embodiment, the second encapsulant 132 may be formed so as not to cover the upper surface of the first encapsulant 131, thereby reducing the thickness of the package 100.

As a detailed form of the first and second encapsulants 131 and 132, the second encapsulant 132 may not cover the upper surface of the first encapsulant 131. In this case, the upper surface of the first encapsulant 131 and the upper surface of the second encapsulant 132 may be coplanar. In addition, when the metal layer 156 is disposed on the upper surface of the first encapsulant 131, the upper surface of the second encapsulant 132 and an upper surface of the metal layer 156 formed on the upper surface of the first encapsulant 131 may be co-planar. However, the second encapsulant 132 does not necessarily have to be formed to a height equal to or similar to that of the first encapsulant 131, and a level of the upper surface of the second encapsulant 132 may be lower than a level of the upper surface of the first encapsulant 131. Further, as described below, the second encapsulant 132 may also cover a portion of the first encapsulant 131 (e.g., a portion of an upper surface of the first encapsulant 131).

The passivation layer 150 may protect the connection structure 140 from external physical or chemical damage. The passivation layer 150 may have openings exposing at least portions of the wiring layers 142a and 142b of the connection structure 140. The number of openings formed in the passivation layer 150 may be several tens to several thousands. The passivation layer 150 may include an insulating resin and inorganic filler, but may not include a glass fiber. For example, the passivation layer 150 may be formed of ABF, but is not limited thereto.

The underbump metal layers 160 may improve connection reliability of the electrical connection metals 170, and thus improve board level reliability of the semiconductor package 100. The underbump metal layers 160 may be connected to the second redistribution layer 142b of the connection structure 140 exposed through the openings of the passivation layer 150. The underbump metal layers 160 may be formed in the openings of the passivation layer 150 by a metallization method using a conductive material such as a metal, but is not limited thereto.

The electrical connection metals 170 may be configured to physically and/or electrically externally connect the semiconductor package 100. For example, the semiconductor package 100 may be mounted on the main board of the electronic device through the electrical connection metals 170. The electrical connection metals 170 may be formed of a low-melting point metal, for example, tin (Sn) or an alloy containing tin (Sn). More specifically, the electrical connection metals 170 may be formed of a solder, or the like. However, this is only an example, and a material of each of the electrical connection metals 170 is not particularly limited thereto. Each of the electrical connection metals 170 may be a land, a ball, a pin, or the like. The electrical connection metals 170 may be formed as a multilayer or single layer structure. When the electrical connection metals 170 are formed as a multilayer structure, the electrical connection metals 170 may include a copper (Cu) pillar and a solder. When the electrical connection metals 170 are formed as a single layer structure, the electrical connection metals 170 may include a tin-silver solder or copper (Cu). However, this is only an example, and the electrical connection metals 170 are not limited thereto. The number, an interval, a disposition form, and the like, of electrical connection metals 170 are not particularly limited, but may be modified depending on design particulars. For example, the electrical connection metals 170 may be provided in an amount of several tens to several thousands according to the number of connection pads 122, or may also be provided in an amount of several tens to several thousands or more or several tens to several thousands or less.

At least one of the electrical connection metals 170 may be disposed in a fan-out region. The fan-out region is a region except for (or outside of) a region in which the semiconductor chip 120 is disposed (e.g., a region outside of a region of overlap with the semiconductor chip 120, in a stacking direction of the semiconductor chip 120 on the connection structure 140). The fan-out package may have reliability greater than that of a fan-in package, may implement a plurality of I/O terminals, and may easily perform 3D interconnection. In addition, as compared to a ball grid array (BGA) package, a land grid array (LGA) package, or the like, the package may be manufactured to have a small thickness, and may have price competitiveness.

Meanwhile, the exemplary embodiment of FIGS. 9 and 10 illustrates the form in which the passive components 125 and 126 are disposed in the same through-hole H in the frame 111, but may be modified as shown in FIG. 12. In a modified example of FIG. 12, the semiconductor chip 120 and the passive components 125 and 126 may be disposed in different through-holes H2, H3, and H4 in the frame 111, and metal layers 151, 154, and 155 may be each disposed on an inner wall of a respective one of the through-holes H2, H3, and H4.

FIGS. 13 through 18 are schematic views illustrating an example of a process of manufacturing the semiconductor package of FIG. 9.

Figure 13:
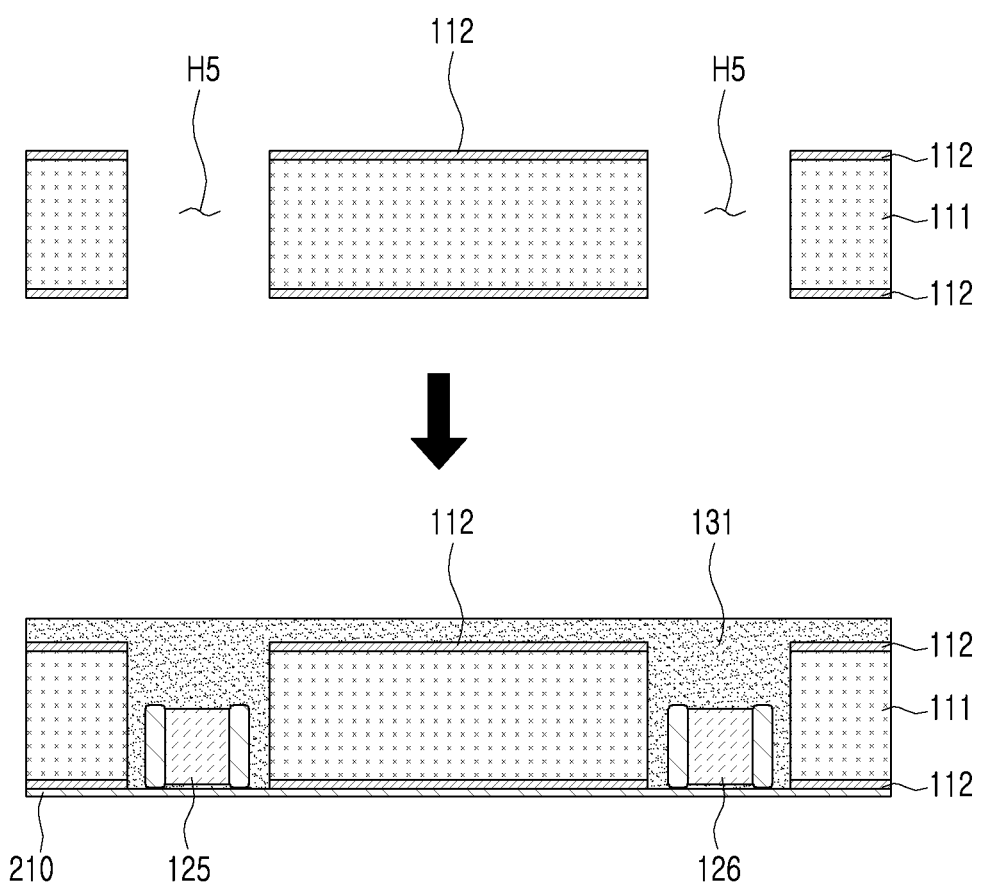
FIGS. 13 through 18 are schematic views illustrating an example of processes of manufacturing the semiconductor package of FIG. 9.

First, as shown in FIG. 13, a frame 111 having a wiring layer 112 formed on a surface thereof may be prepared. The frame 111 may be obtained by machining, for example, a copper clad laminate (CCL). FIG. 13 illustrates a state in which the wiring layer 112 is formed on the surface of the frame 111 (e.g., on two opposing surfaces of the frame 111), but the wiring layer 112 may also be formed during a subsequent process. Through-holes H5 may be formed in the frame 111 by using a laser drill and/or a mechanical drill or sandblast. The through-holes H5 may penetrate through one or more surfaces of the frame 111 having the wiring layer 112 thereon. Next, an adhesive film 210 may be attached to a lower side of the frame 111, and passive components 125 and 126 may be disposed on the adhesive film 120 in the through-holes H5. The adhesive film 210 may be a film, but is not limited thereto. In addition, the through-holes H5 in which the passive components 125 and 126 are disposed may be separated into two regions, but may also be connected to each other as a single through-hole.

Thereafter, the frame 111 and the passive components 125 and 126 may be encapsulated by using a first encapsulant 131. The first encapsulant 131 may be formed by a method of laminating an uncured film and then curing the film, and may also be formed by a method of applying a liquid material and then curing the liquid material. Next, the adhesive film 210 may be removed. As a method of removing the adhesive film 210, a mechanical method may be used.

Figure 14:
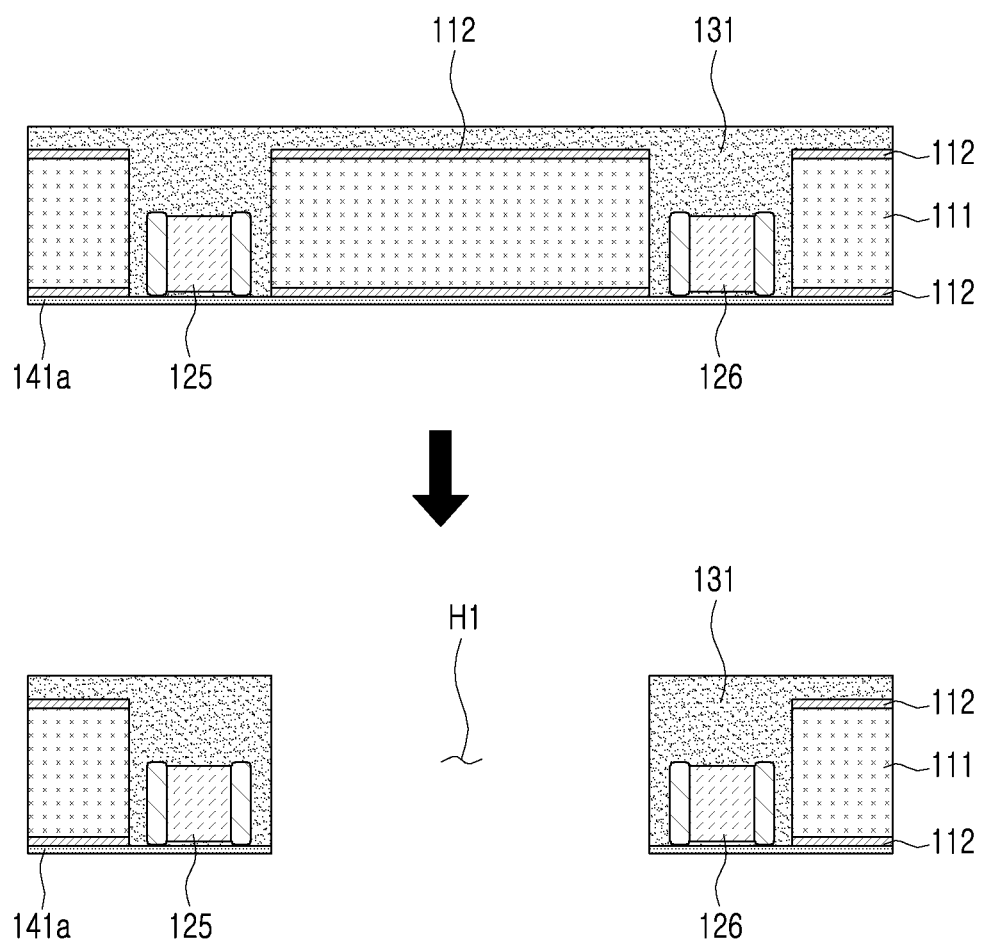

Thereafter, as shown in FIG. 14, a first insulating layer 141a may be formed on a portion or surface from which the adhesive film 210 is removed by using an ABF lamination method, or the like, and a portion of the frame 111 may be removed to form a through-hole H1 in the first encapsulant 131. FIG. 14 illustrates the form in which a portion of the frame 111 is removed to form the through-hole H1. The frame 111 and the first encapsulant 131 may be removed together to form the through-hole H1 and in some cases, only the first encapsulant 131 may be removed. The through-hole H1 may also extend through the first insulating layer 141a.

Figure 15:
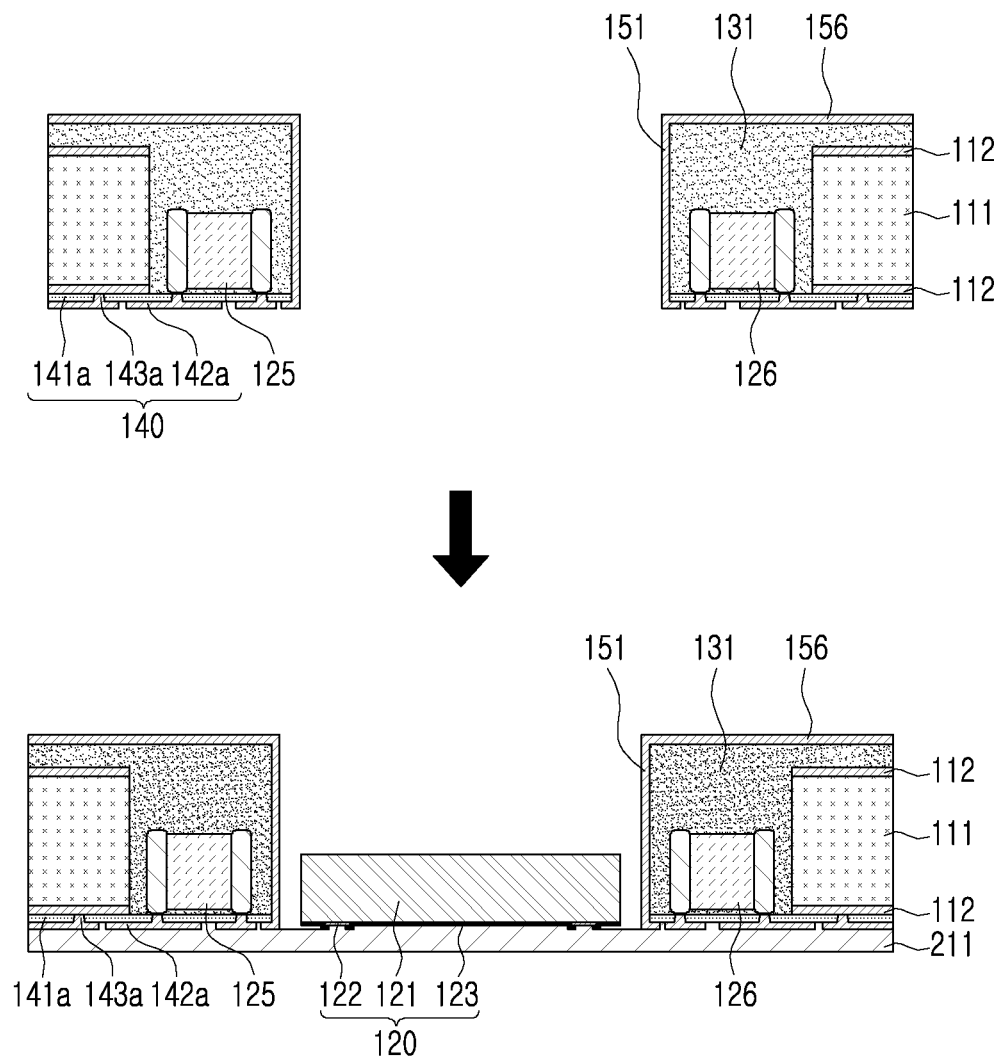

Thereafter, as shown in FIG. 15, after via holes are formed in the first insulating layer 141a by a laser-via, a first wiring layer 142a and the first connection via 143a may be formed by a plating process such as SAP or MSAP. That is, the first wiring layer 142a and the first connection via 143a may include a seed layer and a conductor layer having a thickness greater than that of the seed layer, respectively. In addition, metal layers 151 and 156 may be formed on an inner wall of the through-hole H1 and an upper surface of the first encapsulant 131 by a plating process, or the like. Next, an adhesive film 211 may be attached to a lower portion of the first insulating layer 141a, and a semiconductor chip 120 may be attached onto the adhesive film 211 in a facedown form. As described above, a thickness of the semiconductor chip 120 may be smaller than that of each of the passive components 125 and 126, and may also be smaller than that of the frame 111.

Figure 16:
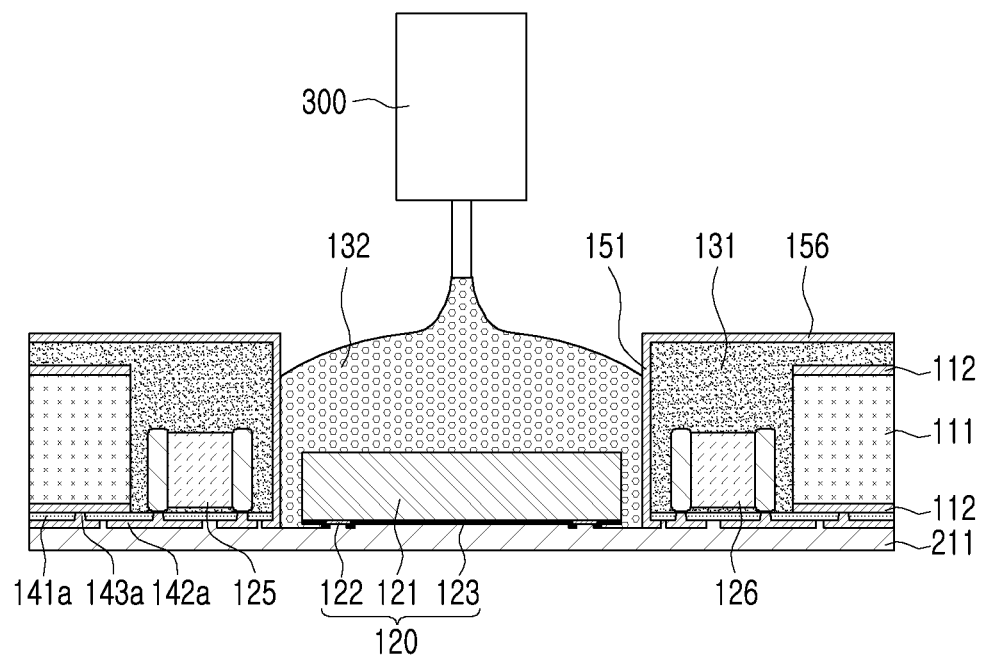

Next, as shown in FIG. 16, a second encapsulant 132 may be formed by selectively applying an encapsulating material around the semiconductor chip 120 in the through-hole H1 by using a dispenser 300. Accordingly, the semiconductor chip 120 may be encapsulated. By such a selective application process, the second encapsulant 132 may be effectively formed in a limited region, for example, the through-hole H1 of the first encapsulant 131, and a compact package may be implemented. However, in addition to such a selective application process, the second encapsulant 132 may be formed by a method of laminating an uncured film and then curing the film, and may also be formed by a method of applying a liquid material and then curing the liquid material.

Figure 17:
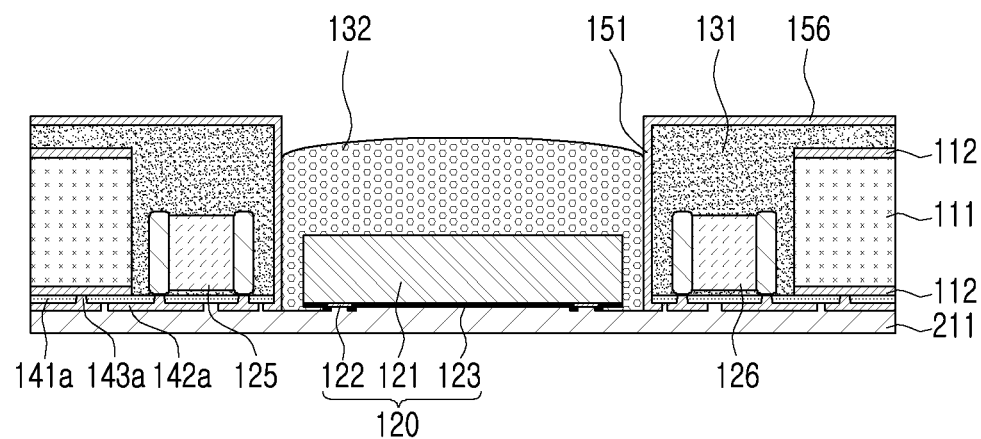
Figure 18:
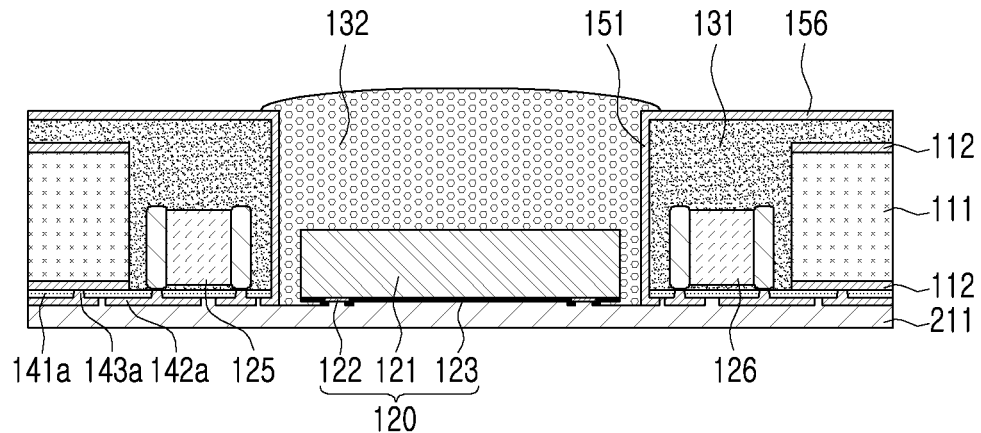

Meanwhile, a height of the second encapsulant 132 may be adjusted by adjusting an amount of the encapsulating material sprayed from the dispenser 300, and as shown in FIG. 17, a level of an upper surface of the second encapsulant 132 may be lower than a level of an upper surface of the first encapsulant 131. Unlike this, when the amount of the encapsulating material is increased, a portion of the second encapsulant 132 may also cover the upper surface of the first encapsulant 131. That is, as shown in FIG. 18, the second encapsulant 132 may cover only a portion of the upper surface of the first encapsulant 131. In this case, a region of the second encapsulant 132 covering the upper surface of the first encapsulant 131 may exist only in the vicinity of the though-hole H1 having the semiconductor chip 120 therein. In addition, the upper surface of the second encapsulant 132 may have an upwardly convex shape. As such, the second encapsulant 132 is formed only on a local region, but in the present exemplary embodiment, it is not excluded that a portion of the second encapsulant 132 slightly overflows to the region of the first encapsulant 131 around the semiconductor chip 120.

Thereafter, a connection structure 140 may be formed by removing the adhesive film 211 and then forming a second insulating layer 141b on the first insulating layer 141a and an active surface of the semiconductor chip 120 by lamination of a photo imageable dielectric (PID) material, or the like, and forming via holes by a photo-via and similarly then forming a second wiring layer 142b and a second connection via 143b by a plating process. The second wiring layer 142b and the second connection via 143b may also include a seed layer and a conductor layer. Next, a passivation layer 150 may be formed on the connection structure 140 by a lamination method or coating method. In addition, underbump metal layers 160 may be formed by a plating process in openings formed in the passivation layer 150. The underbump metal layer 160 may also include a seed layer and a conductor layer. Next, when electrical connection structures 170 are formed on the underbump metal layers 160, the semiconductor package 100 according to an example described above may be manufactured.

FIGS. 19 through 22 illustrate semiconductor packages according to modified examples. Hereinafter, modified portions in the above-described exemplary embodiments will be mainly described.

Figure 19:
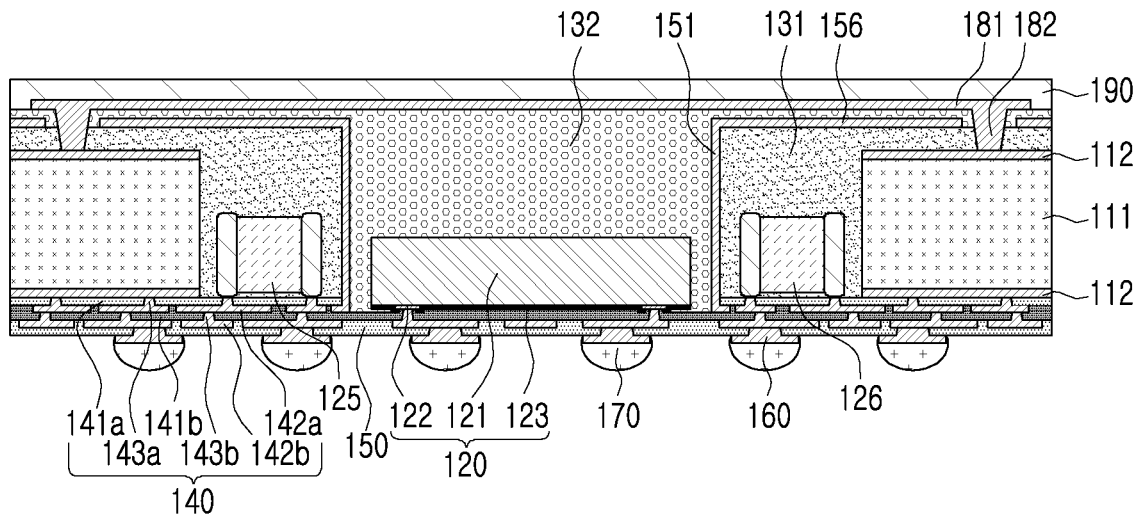
FIGS. 19 through 22 illustrate semiconductor packages according to modified examples in the present disclosure.

First, a semiconductor package according to an exemplary embodiment of FIG. 19 may further include a backside metal layer 181 disposed on the second encapsulant 132. In this case, a cover layer 190 covering the backside metal layer 181 may be employed to protect the backside metal layer 181. The cover layer 180 may include an insulating resin and inorganic filler, but may not include a glass fiber. For example, the cover layer 190 may be formed of ABF, but is not limited thereto. The passivation layer 150 and the cover layer 190 may include the same material and also serve to control a coefficient of thermal expansion (CTE) with a symmetrical effect.

The backside metal layer 181 may be disposed to cover the semiconductor chip 120 and the passive components 125 and 126, and may be connected to the wiring layer 112 or the like through a backside metal via 182 penetrating through the first and second encapsulants 131 and 132. Since the semiconductor chip 120 and the passive components 125 and 126 may be surrounded by a shielding layer through the backside metal layer 181 and the backside metal via 182, an EMI shielding effect and a heat dissipation effect may be further improved. A material of each of the backside metal layer 181 and the backside metal via 182 may be a conductive material such as copper (Cu), aluminum (Al), silver (Ag), tin (Sn), gold (Au), nickel (Ni), lead (Pb), titanium (Ti), or alloys thereof. The backside metal layer 181 and the backside metal via 182 may be used as a ground, and in this case, may be electrically connected to the grounds of the wiring layers 142a and 142b of the connection structure 140 through the metal layer 151, the wiring layer 112, and the like. The backside metal layer 181 may have a plate form covering most of the upper surface of the second encapsulant 132.

Figure 20:
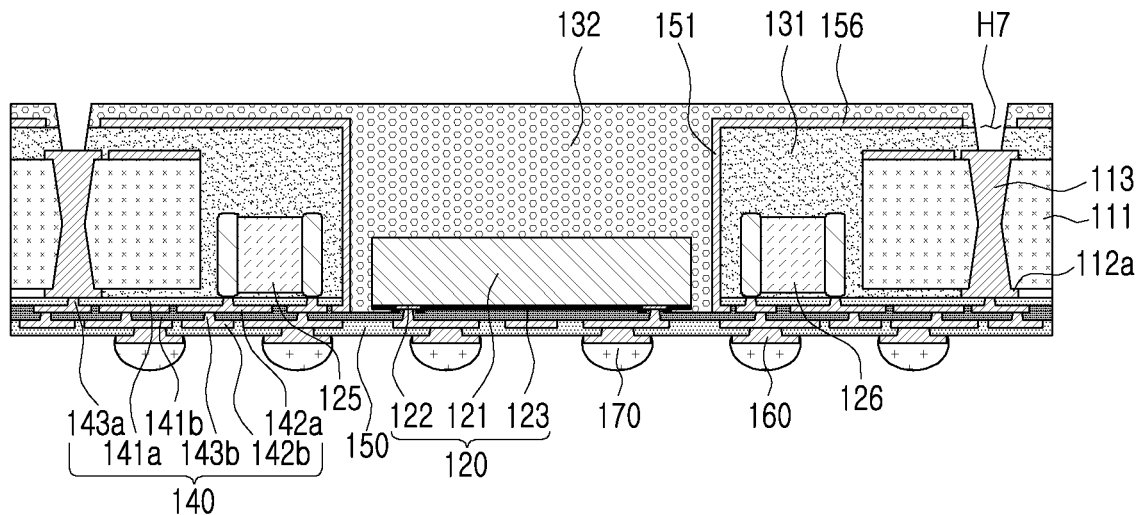

In a semiconductor package according to an exemplary embodiment of FIG. 20, the frame 111 may include wiring layers 112a disposed on a lower surface and an upper surface thereof, respectively, and wiring vias 113 penetrating through the frame 111 and connecting the wiring layers 112a to each other. In addition, as shown, the wiring vias 113 may have an hourglass shape. The frame 111 may have a structure in which a metal layer 113 forming a through-hole is formed, and may perform an electromagnetic wave shielding function, a heat dissipation function, or the like. The metal layer 113 may include copper (Cu), aluminum (Al), silver (Ag), tin (Sn), gold (Au), nickel (Ni), lead (Pb), titanium (Ti), or alloys thereof, but is not limited thereto. In this case, portions of the first and second encapsulants 131 and 132 may be removed to form open regions H7. As a result, at least a portion of the wiring layer 112a may be exposed.

Figure 21:
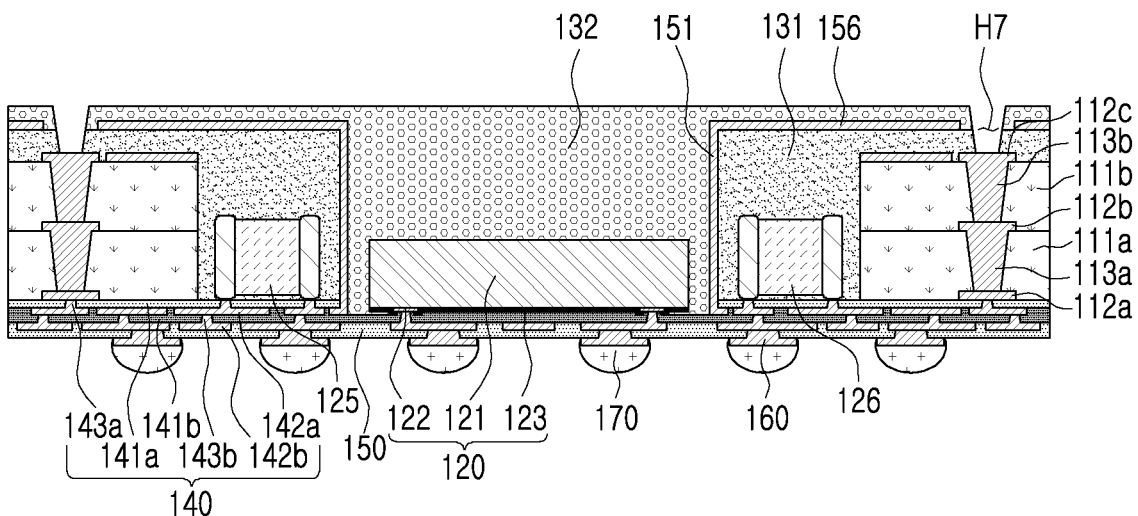

A semiconductor package according to an exemplary embodiment of FIG. 21 may also have a modified form of the frame, and may include a first frame 111a in contact with a connection structure 140, a first wiring layer 112a in contact with the connection structure 140 and embedded in the first frame 111a, a second wiring layer 112b disposed on another surface of the first frame 111a opposing one surface of the first frame 111a in which the first wiring layer 112a is embedded, a second frame 111b disposed on the first frame 111a and covering at least a portion of the second wiring layer 112b, and a third wiring layer 112c disposed on the second frame 111b. The first to third wiring layers 112a, 112b, and 112c may be electrically connected to connection pads 122. The first and second wiring layers 112a and 112b and the second and third wiring layers 112b and 112c may be electrically connected to each other through first and second vias 113a and 113b penetrating through the first and second frames 111a and 111b, respectively. In addition, similarly to the exemplary embodiment described above, portions of the first and second encapsulants 131 and 132 may be removed to form open regions H7. As a result, at least a portion of the wiring layer 112c may be exposed.

The first wiring layer 112a may be recessed into the first frame 111a. As described above, when the first wiring layer 112a is recessed into the first frame 111a and a lower surface of the first frame 111a and a lower surface of the first wiring layer 112a have a step therebetween, a phenomenon in which a material of the first encapsulant 131 bleeds to pollute the first wiring layer 112a may be prevented. A thickness of each of the wiring layers 112a, 112b, and 112c may be greater than that of the wiring layer 142b of the connection structure 140.

A material of each of the frames 111a and 111b is not particularly limited. For example, an insulating material may be used as the material of the frames 111a and 111b. In this case, a thermosetting resin such as an epoxy resin, a thermoplastic resin such as polyimide, a resin in which the thermosetting resin and the thermoplastic resin are mixed with an inorganic filler, for example, an Ajinomoto Build-up Film (ABF), or the like, may be used as the insulating material. Alternatively, a PID resin may also be used as the insulating material.

When holes for the first wiring vias 113a are formed, some of the pads of the first wiring layer 112a may serve as a stopper, and it may thus be advantageous in a process that each of the first vias 113a has the tapered shape of which a width of an upper surface is greater than that of a lower surface. In this case, the first wiring vias 113a may be integrated with pad patterns of the second wiring layer 112*b*. In addition, when holes for the second wiring vias 113*b* are formed, some of the pads of the second wiring layer 112*b* may serve as a stopper, and it may thus be advantageous in a process that each of the second wiring vias 113*b* has the tapered shape of which a width of an upper surface is greater than that of a lower surface. In this case, the second wiring vias 113*b* may be integrated with pad patterns of the third wiring layer 112*c*.

Figure 22:
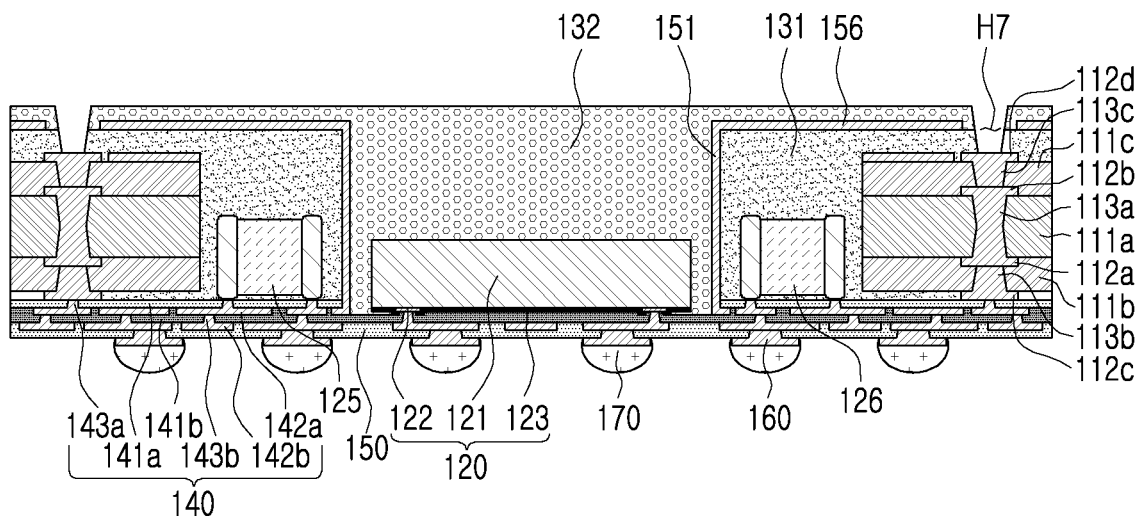

In a case of an exemplary embodiment of FIG. 22, a semiconductor package may include a first frame 111*a*, a first wiring layer 112*a* and a second wiring layer 112*b* which are disposed on a lower surface and an upper surface of the first frame 111*a*, respectively, a second frame 111*b* disposed on the lower surface of the first frame 111*a* and covering at least a portion of the first wiring layer 112*a*, a third wiring layer 112*c* disposed on a lower surface of the second frame 111*b*, a third frame 111*c* disposed on the upper surface of the first frame 111*a* and covering at least a portion of the second wiring layer 112*b*, and a fourth wiring layer 112*d* disposed on an upper surface of the third frame 111*c*. The first to fourth wiring layers 112*a*, 112*b*, 112*c*, and 112*d* may be electrically connected to connection pads 122. Since the frame may include a larger number of wiring layers 112*a*, 112*b*, 112*c*, and 112*d*, a connection structure 140 may be further simplified. Therefore, a decrease in a yield depending on a defect occurring in a process of forming the connection structure 140 may be suppressed. Meanwhile, the first to fourth wiring layers 112*a*, 112*b*, 112*c*, and 112*d* may be electrically connected to each other through first to third wiring vias 113*a*, 113*b*, and 113*c* each penetrating through the first to third frames 111*a*, 111*b*, and 111*c*, respectively. In addition, similarly to the exemplary embodiment described above, portions of the first and second encapsulants 131 and 132 may be removed to form open regions H7. As a result, at least a portion of the wiring layer 112*d* may be exposed.

The first frame 111*a* may include an insulating material different from those of the second frame 111*b* and the third frame 111*c*. For example, the first frame 111*a* may be, for example, prepreg including a core material, a filler, and an insulating resin, and the second frame 111*b* and the third frame 111*c* may be an ABF or a PID including a filler and an insulating resin, but are not limited thereto. Similarly, the first wiring vias 113*a* penetrating through the first frame 111*a* may have a diameter greater than those of second and third wiring vias 113*b* and 113*c* each penetrating through the second and third frames 111*b* and 111*c*. Similarly, a thickness of each of the wiring layers 112*a*, 112*b*, 112*c*, and 112*d* may be greater than that of the wiring layers 142*a* and/or 142*b* of the connection structure 140.

Figure 23:
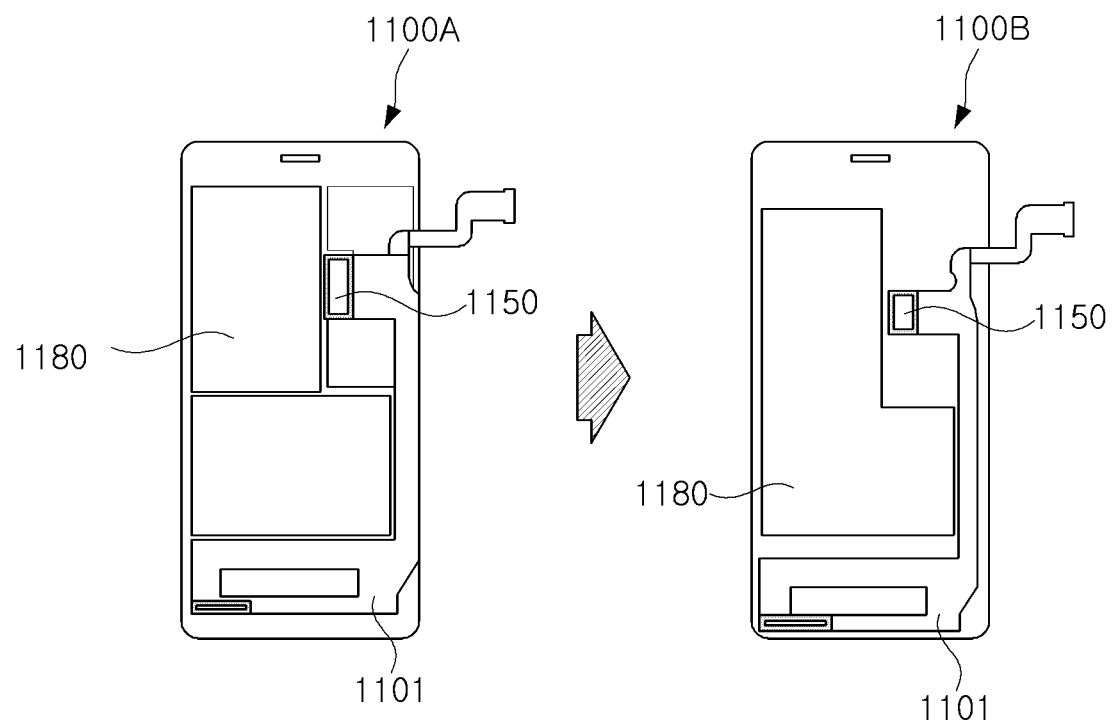
FIG. 23 is a schematic plan view illustrating the semiconductor package according to the exemplary embodiments in the present disclosure applied to an electronic device.

FIG. 23 is a schematic plan view illustrating the semiconductor package according to the exemplary embodiments in the present disclosure applied to the electronic device.

Referring to FIG. 23 recently, in accordance with an increase in a size of displays for mobile apparatuses 1100A and 1100B, the need to increase capacity of batteries has increased. In accordance with the increase in the capacity of the batteries, an area occupied by the battery 1180 in the mobile device has increased, and it has been thus requested to reduce a size of a printed circuit board 1101 such as a main board. As a result, due to a reduction in the mounting area of the components, an area occupied by a module 1150 including the PMIC and the passive components accordingly becomes increasingly small. In this case, when the semiconductor package according to the above-described exemplary embodiments is applied to the module 1150, since the size may be significantly reduced, the reduced area may also be effectively used.

In the present disclosure, terms "lower side", "lower portion", "lower surface", and the like, have been used to indicate a downward direction in relation to cross sections of the drawings, and terms "upper side", "upper portion", "upper surface", and the like, have been used to indicate a direction opposing the direction indicated by the terms "lower side", "lower portion", "lower surface", and the like. However, these directions are defined for convenience of explanation, and the claims are not particularly limited by the directions defined as described above, and the concept of the upper portion and the lower portion may be changed at any time.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiment in the present disclosure, the mounting area of the semiconductor chip and the passive components may be significantly reduced, and the electrical paths between the semiconductor chip and the passive components may be significantly reduced. Further, the semiconductor chip can have a reduced thickness and advantageously enables for miniaturization.

While exemplary embodiments have been shown and described above, it will be apparent to those skilled in the art that modifications and variations could be made without departing from the scope of the present invention as defined by the appended claims.

What is claimed is:
1. A semiconductor package comprising:
a connection structure including an insulating layer, a wiring layer disposed on the insulating layer, and a connection via penetrating through the insulating layer and connected to the wiring layer;
a frame disposed on the connection structure and having a first through-hole penetrating through the frame;

a semiconductor chip and a passive component disposed on the connection structure in the first through-hole of the frame;

a first encapsulant covering at least a portion of the passive component and having a second through-hole penetrating through the first encapsulant; and a second encapsulant disposed in the second through-hole and covering at least a portion of the semiconductor chip, wherein the semiconductor chip is disposed in the second through-hole and spaced apart from a wall surface of the second through-hole and surrounded by the wall surface of the second through-hole.

2. The semiconductor chip of claim 1, wherein an upper surface of the first encapsulant and an upper surface of the second encapsulant are coplanar.

3. The semiconductor chip of claim 1, wherein the second encapsulant does not extend over an upper surface of the first encapsulant.

4. The semiconductor chip of claim 1, wherein the semiconductor chip has a thickness, measured orthogonally to a surface of the connection structure on which the semiconductor chip is disposed, which is smaller than a thickness of the passive component, measured orthogonally to a surface of the connection structure on which the passive component is disposed.

5. The semiconductor chip of claim 1, wherein the second through-hole is positioned in the first through-hole.

6. The semiconductor chip of claim 1,
wherein a height of the wall surface of the second through-hole is greater than a height of a wall surface of the first through-hole.

7. The semiconductor chip of claim 1, wherein a metal layer is disposed on the wall surface of the second through-hole.

8. The semiconductor chip of claim 7, wherein the metal layer extends to cover an upper surface of the first encapsulant, and
an upper surface of the second encapsulant and an upper surface of the metal layer formed on the upper surface of the first encapsulant are coplanar.

9. The semiconductor chip of claim 1, wherein the second encapsulant is filled between the semiconductor chip and the wall surface of the second through-hole.

10. The semiconductor chip of claim 1, wherein a metal layer is disposed on an inner wall of the first through-hole of the frame.

11. The semiconductor chip of claim 1, wherein the semiconductor chip is disposed so that connection pads of the semiconductor chip face towards the connection structure.

12. The semiconductor chip of claim 11, wherein a thickness of a region of the connection structure on which the semiconductor chip is disposed and a thickness of a region of the connection structure on which the passive component is disposed are different from each other.

13. The semiconductor chip of claim 12, wherein the thickness of the region of the connection structure on which the semiconductor chip is disposed is smaller than the thickness of the region of the connection structure on which the passive component is disposed.

14. A semiconductor package comprising:
a connection structure including an insulating layer, a wiring layer disposed on the insulating layer, and a connection via penetrating through the insulating layer and connected to the wiring layer;
a semiconductor chip and a passive component disposed on the connection structure;
a first encapsulant covering at least a portion of the passive component and having a through-hole penetrating through the first encapsulant; and
a second encapsulant disposed in the through-hole and covering at least a portion of the semiconductor chip,
wherein the semiconductor chip is surrounded by a wall surface of the through-hole extending from an upper surface of the first encapsulant to a lower surface of the first encapsulant.

15. The semiconductor package of claim 14, wherein only a region of the first encapsulant in the vicinity of the semiconductor chip is covered by the second encapsulant.

16. The semiconductor package of claim 14, wherein an upper surface of the second encapsulant, facing away from the connection structure, has an upwardly convex shape.

17. A semiconductor package comprising:
a connection structure including an insulating layer, a plurality of wiring layers spaced apart from each other by the insulating layer, and a plurality of connection vias extending between wiring layers through the insulating layer;
a frame disposed on the connection structure and having at least one through-hole extending therethrough;
a semiconductor chip disposed on the connection structure in the at least one through-hole, and having a plurality of connection pads disposed on an active surface of the semiconductor chip that faces the connection structure;
a passive component disposed on the connection structure in the at least one through-hole;
a first encapsulant covering at least a portion of the passive component;
a second encapsulant covering at least a portion of the semiconductor chip; and
a metal layer disposed on a side wall of the first encapsulant or the second encapsulant between the semiconductor chip and the passive component,
wherein the metal layer extends along the side wall of the first encapsulant from the connection structure to a distance greater than a thickness of the frame.

18. The semiconductor package of claim 17, wherein the passive component is disposed in contact with the connection structure, and the semiconductor chip is disposed in contact with the connection structure.

19. The semiconductor package of claim 17, wherein the metal layer is electrically connected to a wiring layer of the connection structure.

* * * * *